US009320126B2

(12) United States Patent
Valcore, Jr. et al.

(10) Patent No.: US 9,320,126 B2
(45) Date of Patent: Apr. 19, 2016

(54) DETERMINING A VALUE OF A VARIABLE ON AN RF TRANSMISSION MODEL

(71) Applicants: John C. Valcore, Jr., Berkeley, CA (US); Bradford J. Lyndaker, San Ramon, CA (US)

(72) Inventors: John C. Valcore, Jr., Berkeley, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 616 days.

(21) Appl. No.: 13/717,538

(22) Filed: Dec. 17, 2012

(65) Prior Publication Data

US 2014/0172335 A1    Jun. 19, 2014

(51) Int. Cl.
| | |
|---|---|
| G01R 25/00 | (2006.01) |
| H05H 1/46 | (2006.01) |
| H03H 7/40 | (2006.01) |
| H01J 37/32 | (2006.01) |
| G06F 17/50 | (2006.01) |
| H01P 3/00 | (2006.01) |

(52) U.S. Cl.
CPC .............. *H05H 1/46* (2013.01); *G06F 17/5036* (2013.01); *H01J 37/32183* (2013.01); *H01J 37/32935* (2013.01); *H03H 7/40* (2013.01); *H01P 3/00* (2013.01); *H05H 2001/4682* (2013.01)

(58) Field of Classification Search
CPC ............ G06F 17/5036; H01J 37/32183; H01J 37/32935; H05H 1/46
USPC ........ 702/65, 64, 57, 188, 137; 700/121, 207; 315/111.21
See application file for complete search history.

(56) References Cited

U.S. PATENT DOCUMENTS

| | | | |
|---|---|---|---|
| 4,353,777 | A | 10/1982 | Jacob |
| 4,377,961 | A | 3/1983 | Bode |

(Continued)

FOREIGN PATENT DOCUMENTS

| | | |
|---|---|---|
| CN | 101110347 A | 1/2008 |
| JP | 2001-127045 A | 5/2001 |

(Continued)

OTHER PUBLICATIONS

Thorsten, Lill et al, "Controlling ION Energy within a Plasma Chamber", U.S. Appl. No. 13/930,138, filed Jun. 28, 2013.

(Continued)

*Primary Examiner* — Gregory J Toatley
*Assistant Examiner* — Eman Alkafawi
(74) *Attorney, Agent, or Firm* — Martine Penilla Group, LLP

(57) ABSTRACT

Systems and methods for determining a value of a variable on a radio frequency (RF) transmission model are described. One of the methods includes identifying a complex voltage and current measured at an output of an RF generator and generating an impedance matching model based on electrical components defined in an impedance matching circuit coupled to the RF generator. The method further includes propagating the complex voltage and current through the one or more elements from the input of the impedance matching model and through one or more elements of an RF transmission model portion that is coupled to the impedance matching model to determine a complex voltage and current at the output of the RF transmission model portion.

20 Claims, 23 Drawing Sheets

(56) References Cited

U.S. PATENT DOCUMENTS

| | | |
|---|---|---|
| 4,420,790 A | 12/1983 | Golke et al. |
| 4,454,001 A | 6/1984 | Sternheim et al. |
| 4,457,820 A | 7/1984 | Bergeron et al. |
| 4,500,563 A | 2/1985 | Ellenberger et al. |
| 5,474,648 A | 12/1995 | Patrick et al. |
| 5,479,340 A | 12/1995 | Fox et al. |
| 5,556,549 A | 9/1996 | Patrick et al. |
| 5,571,366 A | 11/1996 | Ishii et al. |
| 5,689,215 A | 11/1997 | Richardson et al. |
| 5,694,207 A | 12/1997 | Hung et al. |
| 5,737,177 A | 4/1998 | Mett et al. |
| 5,764,471 A | 6/1998 | Burkhart |
| 5,788,801 A | 8/1998 | Barbee et al. |
| 5,810,963 A | 9/1998 | Tomioka |
| 5,812,361 A | 9/1998 | Jones et al. |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven et al. |
| 5,980,767 A | 11/1999 | Koshimizu et al. |
| 5,989,999 A | 11/1999 | Levine et al. |
| 6,020,794 A | 2/2000 | Wilbur |
| 6,021,672 A | 2/2000 | Lee |
| 6,042,686 A | 3/2000 | Dible et al. |
| 6,048,435 A | 4/2000 | DeOrnellas et al. |
| 6,110,214 A | 8/2000 | Klimasauskas |
| 6,157,867 A | 12/2000 | Hwang et al. |
| 6,198,616 B1 | 3/2001 | Dahimene et al. |
| 6,246,972 B1 | 6/2001 | Klimasauskas |
| 6,441,555 B1* | 8/2002 | Howald et al. ............ 315/111.51 |
| 6,472,822 B1 | 10/2002 | Chen et al. |
| 6,522,121 B2 | 2/2003 | Coumou |
| 6,535,785 B2 | 3/2003 | Johnson et al. |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,781,317 B1 | 8/2004 | Goodman |
| 6,823,815 B2 | 11/2004 | Han et al. |
| 6,838,635 B2 | 1/2005 | Hoffman et al. |
| 6,862,557 B2 | 3/2005 | Jones et al. |
| 6,873,114 B2 | 3/2005 | Avoyan et al. |
| 6,972,524 B1 | 12/2005 | Marakhtanov et al. |
| 6,983,215 B2 | 1/2006 | Coumou et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,323,116 B2 | 1/2008 | Guiney et al. |
| 7,359,177 B2 | 4/2008 | Yang et al. |
| 7,361,287 B2 | 4/2008 | Laermer |
| 7,375,038 B2 | 5/2008 | Kumar |
| 7,435,926 B2 | 10/2008 | Jafarian-Tehrani |
| 7,459,100 B2 | 12/2008 | Kiermasz et al. |
| 7,480,571 B2 | 1/2009 | Howald et al. |
| 7,505,879 B2 | 3/2009 | Tomoyasu et al. |
| 7,586,100 B2 | 9/2009 | Raj et al. |
| 7,728,602 B2 | 6/2010 | Valcore et al. |
| 7,764,140 B2 | 7/2010 | Nagarkatti et al. |
| 7,768,269 B2 | 8/2010 | Pipitone et al. |
| 7,858,898 B2 | 12/2010 | Bailey, III et al. |
| 7,967,944 B2 | 6/2011 | Shannon et al. |
| 8,040,068 B2 | 10/2011 | Coumou et al. |
| 8,053,991 B2 | 11/2011 | Kim et al. |
| 8,080,168 B2 | 12/2011 | Cirigliano |
| 8,080,760 B2 | 12/2011 | Dhindsa et al. |
| 8,103,492 B2 | 1/2012 | Brcka |
| 8,264,238 B1 | 9/2012 | El-Chouelry |
| 8,271,121 B2 | 9/2012 | Venugopal et al. |
| 8,368,308 B2 | 2/2013 | Banna et al. |
| 8,404,598 B2 | 3/2013 | Liao et al. |
| 8,501,631 B2 | 8/2013 | Valcore et al. |
| 8,679,358 B2 | 3/2014 | Nakagawa |
| 8,901,935 B2 | 12/2014 | Valcore et al. |
| 2003/0082835 A1 | 5/2003 | McChesney et al. |
| 2003/0103793 A1 | 6/2003 | Murakoshi et al. |
| 2003/0119308 A1 | 6/2003 | Geefay et al. |
| 2004/0028837 A1 | 2/2004 | Fink |
| 2004/0045506 A1 | 3/2004 | Chen et al. |
| 2004/0060660 A1 | 4/2004 | Klimecky et al. |
| 2004/0061448 A1 | 4/2004 | Avoyan et al. |
| 2004/0087047 A1 | 5/2004 | Jaiswal et al. |
| 2004/0107906 A1 | 6/2004 | Collins et al. |
| 2004/0135590 A1 | 7/2004 | Quon |
| 2004/0222184 A1 | 11/2004 | Hayami et al. |
| 2004/0226657 A1 | 11/2004 | Hoffman |
| 2005/0039682 A1 | 2/2005 | Dhindsa et al. |
| 2005/0057165 A1 | 3/2005 | Goodman |
| 2005/0090118 A1 | 4/2005 | Shannon et al. |
| 2005/0133163 A1 | 6/2005 | Shannon et al. |
| 2005/0134186 A1 | 6/2005 | Brouk et al. |
| 2005/0151479 A1 | 7/2005 | Avoyan et al. |
| 2005/0205532 A1* | 9/2005 | Patrick et al. ............ 219/121.43 |
| 2005/0217797 A1 | 10/2005 | Jafarian-Tehrani |
| 2005/0241762 A1 | 11/2005 | Paterson et al. |
| 2005/0252884 A1 | 11/2005 | Lam et al. |
| 2006/0054596 A1 | 3/2006 | Howard |
| 2006/0065623 A1 | 3/2006 | Guiney et al. |
| 2006/0065631 A1 | 3/2006 | Cheng et al. |
| 2006/0065632 A1 | 3/2006 | Cheng et al. |
| 2006/0088655 A1* | 4/2006 | Collins et al. .................... 427/8 |
| 2006/0100824 A1 | 5/2006 | Moriya |
| 2006/0169582 A1 | 8/2006 | Brown et al. |
| 2006/0231526 A1 | 10/2006 | Donohue |
| 2006/0232471 A1 | 10/2006 | Coumou |
| 2007/0021935 A1 | 1/2007 | Larson et al. |
| 2007/0065594 A1 | 3/2007 | Chiang et al. |
| 2007/0095788 A1* | 5/2007 | Hoffman et al. ................ 216/59 |
| 2007/0127188 A1 | 6/2007 | Yang et al. |
| 2007/0247074 A1 | 10/2007 | Paterson et al. |
| 2007/0252580 A1 | 11/2007 | Dine et al. |
| 2007/0262723 A1 | 11/2007 | Ikenouchi |
| 2008/0241016 A1 | 10/2008 | Kato et al. |
| 2009/0151871 A1 | 6/2009 | Pease et al. |
| 2009/0255800 A1 | 10/2009 | Koshimizu |
| 2009/0284156 A1 | 11/2009 | Banna et al. |
| 2009/0294061 A1 | 12/2009 | Shannon et al. |
| 2009/0295296 A1 | 12/2009 | Shannon et al. |
| 2009/0308734 A1 | 12/2009 | Krauss |
| 2010/0099266 A1 | 4/2010 | Oswald et al. |
| 2010/0136793 A1* | 6/2010 | Chen et al. .................... 438/710 |
| 2010/0248488 A1 | 9/2010 | Agarwal et al. |
| 2010/0270141 A1 | 10/2010 | Carter et al. |
| 2010/0332201 A1 | 12/2010 | Albarede et al. |
| 2011/0031216 A1 | 2/2011 | Liao et al. |
| 2011/0097901 A1 | 4/2011 | Banna et al. |
| 2011/0115492 A1 | 5/2011 | Valcore, Jr. et al. |
| 2011/0118863 A1 | 5/2011 | Valcore, Jr. |
| 2011/0137446 A1 | 6/2011 | Valcore, Jr. et al. |
| 2012/0000887 A1 | 1/2012 | Eto et al. |
| 2012/0052689 A1 | 3/2012 | Tokashiki |
| 2012/0073754 A1 | 3/2012 | De la Llera et al. |
| 2012/0187844 A1 | 7/2012 | Hoffman et al. |
| 2012/0227484 A1* | 9/2012 | Chen et al. .................... 73/304 R |
| 2012/0262064 A1 | 10/2012 | Nagarkatti et al. |
| 2013/0180951 A1 | 7/2013 | Indrakanti et al. |
| 2014/0062303 A1 | 3/2014 | Hoffman et al. |
| 2014/0066838 A1* | 3/2014 | Hancock ............................ 604/23 |
| 2014/0076713 A1 | 3/2014 | Valcore, Jr. et al. |
| 2014/0305589 A1 | 10/2014 | Valcore, Jr. et al. |
| 2015/0002018 A1 | 1/2015 | Lill et al. |

FOREIGN PATENT DOCUMENTS

| | | |
|---|---|---|
| JP | 2004239211 A | 8/2004 |
| JP | 2004-335594 A | 11/2004 |
| JP | 2005130198 | 5/2005 |
| JP | 2005284046 A | 10/2005 |
| KR | 10-2005-0088438 A | 9/2005 |
| KR | 10-2005-0089995 A | 9/2005 |
| KR | 10-2007-0031915 A | 3/2007 |
| WO | 9914699 A1 | 3/1999 |
| WO | 2008002938 A2 | 1/2008 |

(56) References Cited

FOREIGN PATENT DOCUMENTS

| WO | 2012054306 A2 | 4/2012 |
|---|---|---|
| WO | 2014070838 A1 | 5/2014 |

OTHER PUBLICATIONS

"Electromagnetic Waves and Antennas", Sophocles J. Orfanidis, Rutgers University, Aug. 25, 2013, Chapter 10.10.

Damon et al., "Synchronous Pulsed Plasma for Silicon Etch Applications", ECS Transactions, 27 (1) pp. 717-723 (2010), Publication by: The Electrochemical Society.

PCT/US2010/057478 International Search Report and Written Opinion, mailed Jul. 26, 2011 (6 pages).

PCT/US2011/063422 International Search Report and Written Opinion, mailed Mar. 28, 2012 (9 pages).

PCT/US2010/057450 International Search Report and Written Opinion, mailed Jul. 18. 2011 (9 pages).

PCT/IB2013/051010 International Search Report and Written Opinion, mailed Jul. 3, 2013 (13 pages).

Lars Christoph, Comparison of Applied Materials DPS Chambers used for poly-Si Etch process by Plasma Parameters, Dec. 6, 2000, 2nd workshop on self excited electron plasma resonance spectroscopy, Dresden, Germany.

Christoph Steuer, Tool Comparison at GC Stack Etch in LAM TCP Using Plasma Parameters (SEERS), Dec. 12, 2000, 2nd workshop on self excited electron plasma resonance spectroscopy, Dresden, Germany.

\* cited by examiner

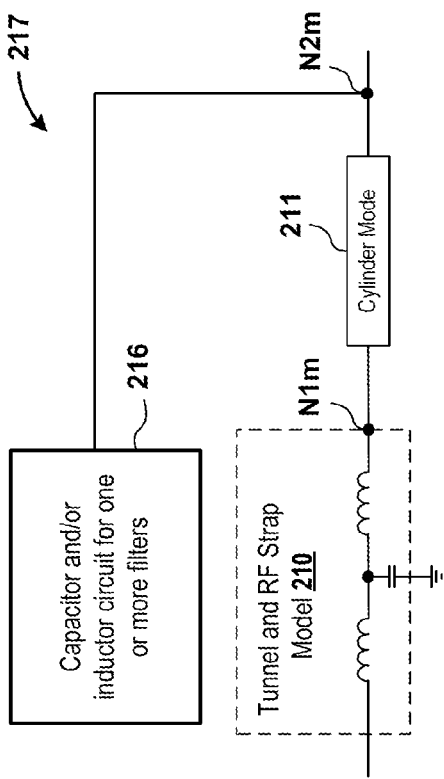
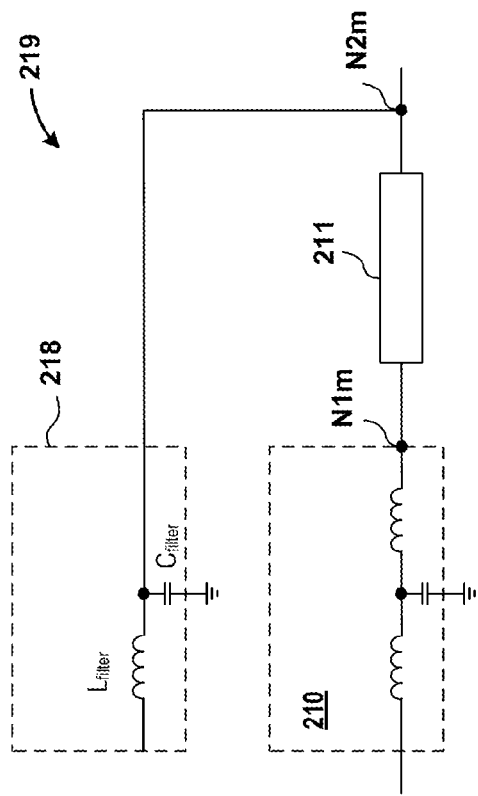

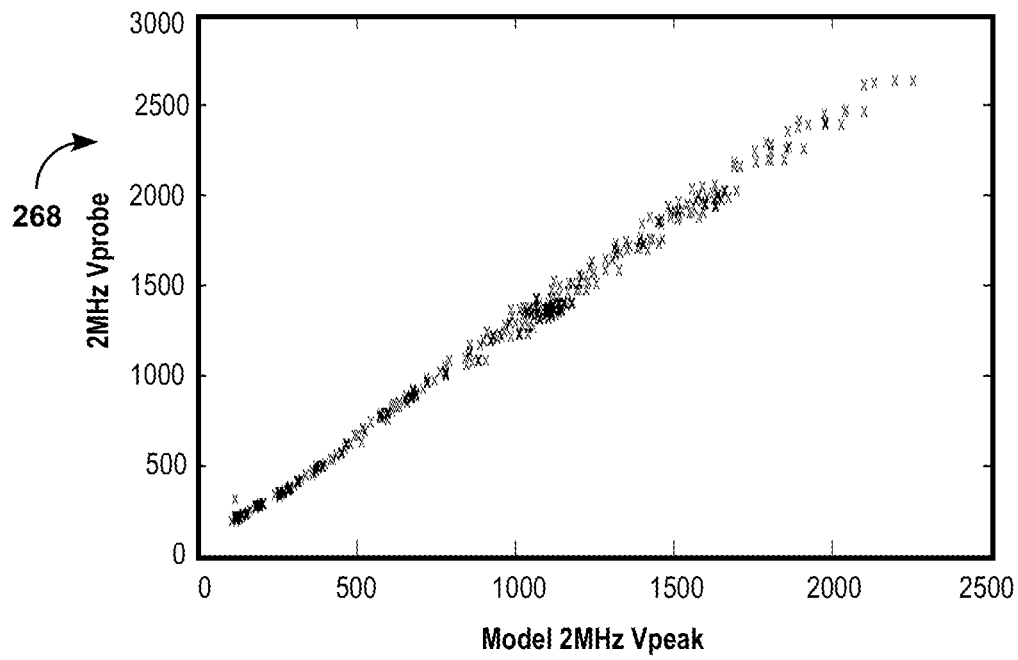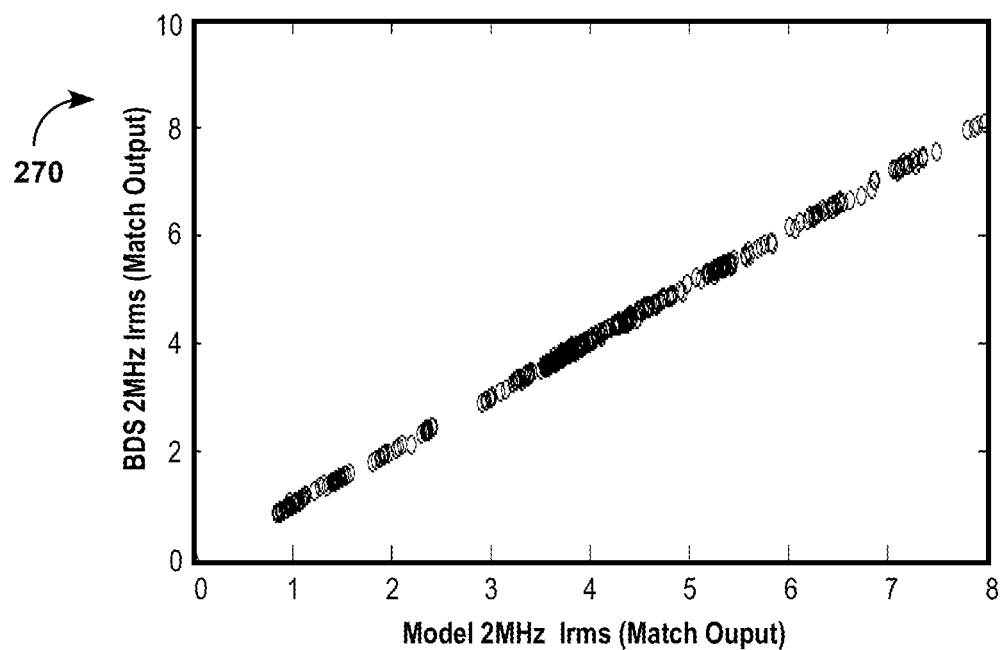
Fig. 11A

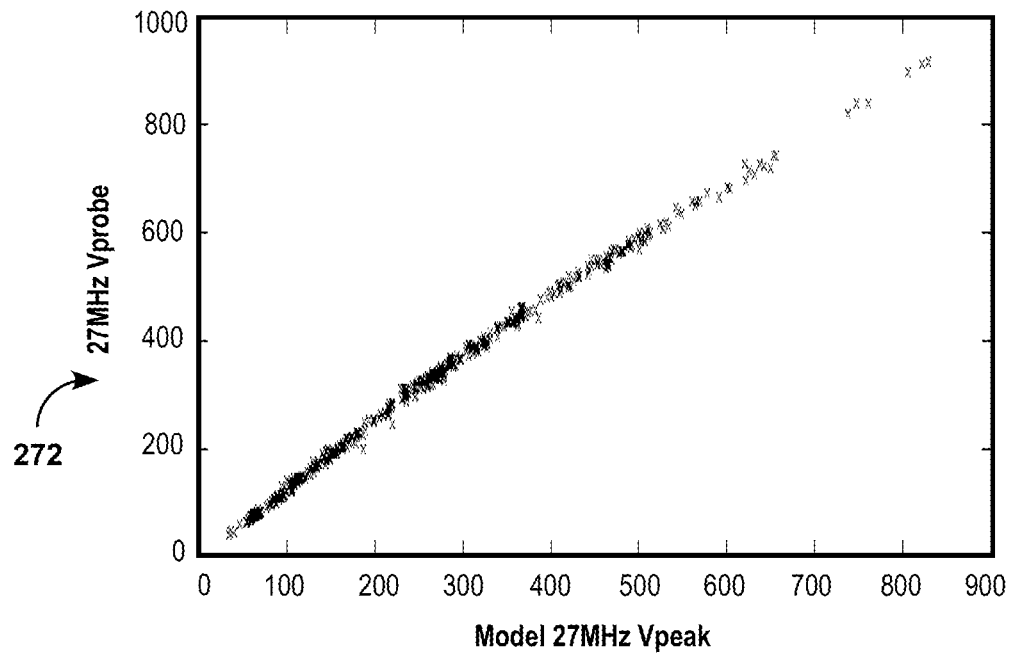
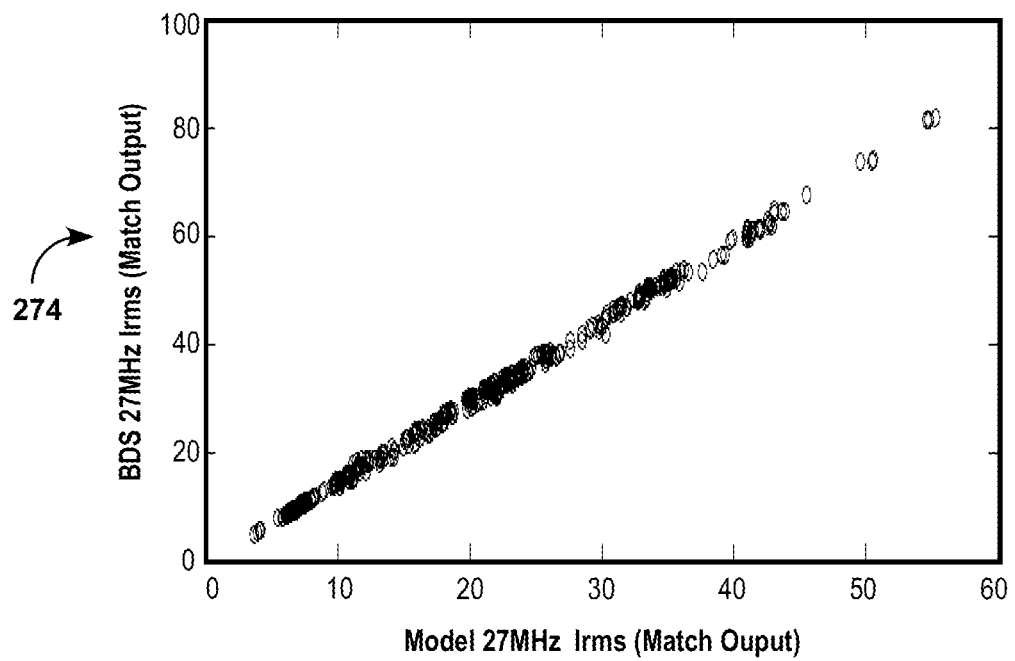
Fig. 11B

DETERMINING A VALUE OF A VARIABLE ON AN RF TRANSMISSION MODEL

FIELD

The present embodiments relate to determining a value of a variable on a radio frequency (RF) transmission line.

BACKGROUND

In a plasma-based system, plasma is generated when a process gas is supplied within a plasma chamber and radio frequency (RF) power is supplied to an electrode within the plasma chamber. The plasma-based system is used to perform various operations on a wafer. For example, the plasma is used to etch the wafer, deposit materials on the wafer, clean the wafer, etc.

During the performance of the operations, a point within the plasma-based system may be monitored to determine whether the plasma-based system is operating properly. The point is monitored using a probe. However, it may be expensive to use the probe within the plasma-based system. For example, some entities may avoid using the probe to avoid the cost of the probe. Such avoidance of use of the probe may result in not knowing whether the plasma-based system is operating properly.

It is in this context that embodiments described in the present disclosure arise.

SUMMARY

Embodiments of the disclosure provide apparatus, methods and computer programs for determining a value of a variable on a radio frequency (RF) transmission line. It should be appreciated that the present embodiments can be implemented in numerous ways, e.g., a process, an apparatus, a system, a piece of hardware, or a method on a computer-readable medium. Several embodiments are described below.

In various embodiments, a computer-generated model of an RF transmission line is used to determine a variable, e.g., a complex voltage, a complex current, a complex voltage and current, complex power, etc., at an output of the model. Instead of a metrology tool, e.g., a probe, the variable is used within a plasma system to determine whether the plasma system is functioning properly.

In some embodiments, a method for determining a value of a variable on a radio frequency (RF) transmission model is described. The method includes identifying a first complex voltage and current measured at an output of an RF generator when the RF generator is coupled to a plasma chamber via an impedance matching circuit. The impedance matching circuit has an input coupled to the output of the RF generator and an output coupled to an RF transmission line. The method includes generating an impedance matching model based on electrical components defined in the impedance matching circuit. The impedance matching model has an input and an output. The input of the impedance matching model is used for receiving the first complex voltage and current. Also, the impedance matching model has one or more elements. The method further includes propagating the first complex voltage and current through the one or more elements from the input of the impedance matching model to the output of the impedance matching model to determine a second complex voltage and current. The second complex voltage and current is at the output of the impedance matching model. The method includes generating an RF transmission model based on circuit components defined in the RF transmission line. The RF transmission model has an input and an output. The input of the RF transmission model is coupled to the output of the impedance matching model. The RF transmission model has a portion that includes one or more elements. The method includes propagating the second complex voltage and current through the one or more elements of the RF transmission model portion from the input of the RF transmission model to an output of the RF transmission model portion to determine a third complex voltage and current. The third complex voltage and current is a complex voltage and current at the output of the RF transmission model portion.

In various embodiments, a plasma system for determining a value of a variable on an RF transmission model is described. The plasma system includes an RF generator for generating an RF signal. The RF generator is associated with a voltage and current probe. The voltage and current probe is configured to measure a first complex voltage and current at an output of the RF generator. The plasma system further includes an impedance matching circuit coupled to the RF generator and a plasma chamber coupled to the impedance matching circuit via an RF transmission line. The impedance matching circuit has an input coupled to the output of the RF generator and an output coupled to the RF transmission line. The plasma system includes a processor coupled to the RF generator. The processor is used for identifying the first complex voltage and current and generating an impedance matching model based on electrical components defined in the impedance matching circuit. The impedance matching model has an input and an output. The input of the impedance matching model receives the first complex voltage and current. Moreover, the impedance matching model has one or more elements. The method includes propagating the first complex voltage and current through the one or more elements from the input of the impedance matching model to the output of the impedance matching model to determine a second complex voltage and current. The second complex voltage and current is a complex voltage and current at the output of the impedance matching model. The method includes generating an RF transmission model based on electrical components defined in the RF transmission line. The RF transmission model has an input and an output. The input of the RF transmission model is coupled to the output of the impedance matching model. Also, the RF transmission model portion has a portion that includes one or more elements. The method includes propagating the second complex voltage and current through the one or more elements of the RF transmission model portion from the input of the RF transmission model to an output of the RF transmission model portion to determine a third complex voltage and current. The third complex voltage and current is a complex voltage and current at the output of the RF transmission model portion. The method includes providing the third complex voltage and current for storage to a storage hardware unit.

In some embodiments, a computer system for determining a value of a variable on an RF transmission model is described. The computer system includes a processor. The processor is configured to identify a first complex voltage and current measured at an output of an RF generator when the RF generator is coupled to a plasma chamber via an impedance matching circuit. The impedance matching circuit has an input coupled to the output of the RF generator and an output coupled to an RF transmission line. The processor is further configured to generate an impedance matching model based on electrical components defined in the impedance matching circuit. The impedance matching model has an input and an output. The input of the impedance matching model receives the first complex voltage and current. Also, the impedance matching model has one or more elements. The processor is configured to propagate the first complex voltage and current through the one or more elements from the input of the impedance matching model to the output of the impedance matching model to determine a second complex voltage and current at the output of the impedance matching model. The processor is also configured to generate an RF transmission model based on electrical components defined in the RF transmission line. The RF transmission model has an input and an output. The input of the RF transmission model is coupled to the output of the impedance matching model. The RF transmission model has a portion that includes one or more elements. The processor is configured to propagate the second complex voltage and current through the one or more elements of the RF transmission model portion from the input of the RF transmission model to an output of the RF transmission model portion to determine a third complex voltage and current at the output of the RF transmission model portion. The computer system includes a memory device coupled to the processor. The memory device is configured to store the third complex voltage and current.

Some advantages of the above-described embodiments include reducing a chance of using a metrology tool at a node of a plasma system during production, which includes performance of processes on a work piece. Examples of the processes include cleaning, depositing, etching, etc. A voltage and current probe that is calibrated according to a pre-set formula is used to accurately sense values and the accurately sensed values are propagated as described above to generate accurate values of the variable at one or more nodes of a model of plasma system. The pre-set formula may be a standard. For example, the voltage and current probe is calibrated according to National Institute of Standards and Technology (NIST) standard, which is rigid. Hence, usage of the voltage and current probe results in values of the variable that are accurate. During production, the generated values are used to determine whether one or more parts, e.g., an impedance matching circuit, an RF generator, a cable, an RF transmission line, a portion of the RF transmission line, etc., of a plasma system that excludes the metrology tool are working appropriately. Instead of using the metrology tool at a node during production, the generated accurate values at the node are used during the production to determine whether one or more parts are working appropriately, e.g., functioning, operational, etc.

Other advantages of the above-described embodiments include reducing chances of unconfinement of plasma from a plasma chamber and arcing within the plasma chamber. Plasma within plasma chamber is confined to perform various processes on a work piece within the plasma chamber. With an increase in unconfinement of the plasma, effectiveness of the plasma on the work piece is reduced. Also, arcing within the plasma chamber is to be detected. In some embodiments, arcing is a sudden release of energy between parts in the plasma chamber. By considering both voltage and current in determining a variable, e.g., impedance, model bias voltage, etc., at the plasma chamber, the unconfinement and the arcing may be more accurately detected at the plasma chamber than using the voltage alone. For example, the variable is determined at the plasma chamber by using the voltage and current probe. The variable is then used during production to accurately determine whether there is unconfinement and/or arcing.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 7A is a diagram of a system used to illustrate a model of the filters to improve an accuracy of the variable, in accordance with an embodiment described in the present disclosure.

FIG. 7B is a diagram of a system used to illustrate a model of the filters, in accordance with an embodiment described in the present disclosure.

FIG. 11A is a diagram of a graph that illustrates a correlation between voltage that is measured at an output within the system of FIG. 1 by using a voltage probe and a voltage that is determined using the method of FIG. 2 when an x MHz RF generator is operational, in accordance with an embodiment described in the present disclosure.

FIG. 11B is a diagram of a graph that illustrates a correlation between voltage that is measured at an output within the system of FIG. 1 by using a voltage probe and a voltage that is determined using the method of FIG. 2 when a y MHz RF generator is operational, in accordance with an embodiment described in the present disclosure.

DETAILED DESCRIPTION

The following embodiments describe systems and methods for determining a value of a variable on a radio frequency (RF) transmission line. It will be apparent that the present embodiments may be practiced without some or all of these specific details. In other instances, well known process operations have not been described in detail in order not to unnecessarily obscure the present embodiments.

Figure 1:
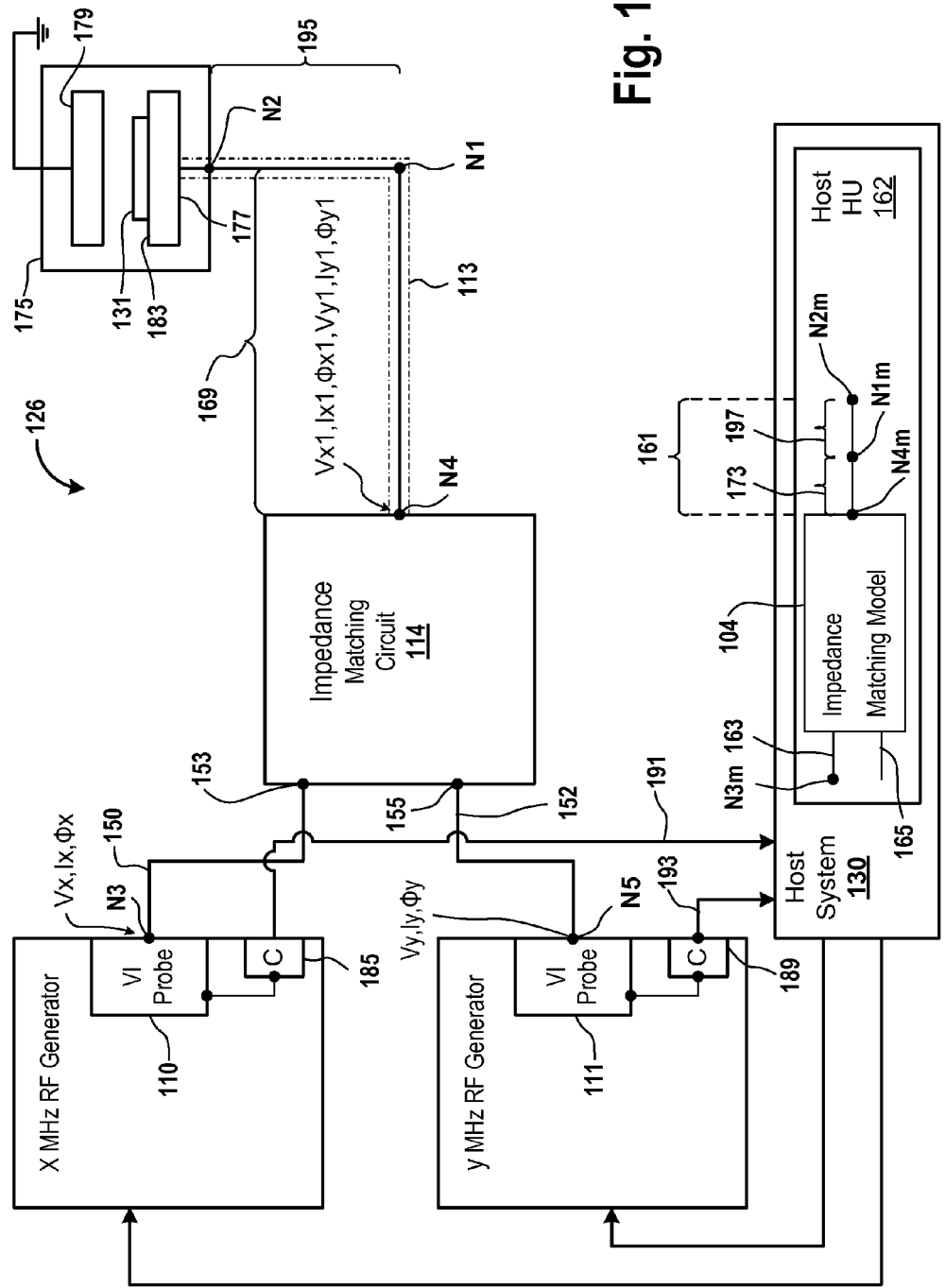
FIG. 1 is a block diagram of a system for determining the variable at an output of an impedance matching model and at an output of a portion of a radio frequency (RF) transmission model, in accordance with an embodiment described in the present disclosure.

FIG. 1 is a block diagram of an embodiment of a system 126 for determining the variable at an output of an impedance matching model 104 and at an output, e.g., a model node N1m, of a portion 173 of an RF transmission model 161, which is a model of an RF transmission line 113. The RF transmission line 113 has an output, e.g., a node N2. A voltage and current (VI) probe 110 measures a complex voltage and current Vx, Ix, and $\phi$x, e.g., a first complex voltage and current, at an output, e.g., a node N3, of an x MHz RF generator. It should be noted that Vx represents a voltage magnitude, Ix represents a current magnitude, and $\phi$x represents a phase between Vx and Ix. The impedance matching model 104 has an output, e.g., a model node N4m.

Moreover, a VI probe 111 measures a complex voltage and current Vy, Iy, and $\phi$y at an output, e.g., a node N5, of a y MHz RF generator. It should be noted that Vy represents a voltage magnitude, Iy represents a current magnitude, and $\phi$y represents a phase between Vy and Iy.

In some embodiments, a node is an input of a device, an output of a device, or a point within the device. A device, as used herein, is described below.

Examples of x MHz include 2 MHz, 27 MHz, and 60 MHz. Examples of y MHz include 2 MHz, 27 MHz, and 60 MHz. The x MHz is different than y MHz. For example, when x MHz is 2 MHz, y MHz is 27 MHz or 60 MHz. When x MHz is 27 MHz, y MHz is 60 MHz.

An example of each VI probe 110 and 111 includes a VI probe that complies with a pre-set formula. An example of the pre-set formula includes a standard that is followed by an Association, which develops standards for sensors. Another example of the pre-set formula includes a National Institute of Standards and Technology (NIST) standard. As an illustration, the VI probe 110 or 111 is calibrated according to NIST standard. In this illustration, the VI probe 110 or 111 is coupled with an open circuit, a short circuit, or a known load to calibrate the VI probe 110 or 111 to comply with the NIST standard. The VI probe 110 or 111 may first be coupled with the open circuit, then with the short circuit, and then with the known load to calibrate the VI probe 110 based on NIST standard. The VI probe 110 or 111 may be coupled to the known load, the open circuit, and the short circuit in any order to calibrate the VI probe 110 or 111 according to NIST standard. Examples of a known load include a 50 ohm load, a 100 ohm load, a 200 ohm load, a static load, a direct current (DC) load, a resistor, etc. As an illustration, each VI probe 110 and 111 is calibrated according NIST-traceable standards.

The VI probe 110 is coupled to the output, e.g., the node N3, of the x MHz RF generator. The output, e.g., the node N3, of the x MHz RF generator is coupled to an input 153 of an impedance matching circuit 114 via a cable 150. Moreover, the VI probe 111 is coupled to the output, e.g., the node N5, of the y MHz RF generator. The output, e.g., the node N5, of the y MHz RF generator is coupled to another input 155 of an impedance matching circuit 114 via a cable 152.

An output, e.g., a node N4, of the impedance matching circuit 114 is coupled to an input of the RF transmission line 113. The RF transmission line 113 includes a portion 169 and another portion 195. An input of the portion 169 is an input of the RF transmission line 113. An output, e.g., a node N1, of the portion 169 is coupled to an input of the portion 195. An output, e.g., the node N2, of the portion 195 is coupled to the plasma chamber 175. The output of the portion 195 is the output of the RF transmission line 113. An example of the portion 169 includes an RF cylinder and an RF strap. The RF cylinder is coupled to the RF strap. An example of the portion 195 includes an RF rod and/or a support for supporting the plasma chamber 175.

The plasma chamber 175 includes an electrostatic chuck (ESC) 177, an upper electrode 179, and other parts (not shown), e.g., an upper dielectric ring surrounding the upper electrode 179, an upper electrode extension surrounding the upper dielectric ring, a lower dielectric ring surrounding a lower electrode of the ESC 177, a lower electrode extension surrounding the lower dielectric ring, an upper plasma exclusion zone (PEZ) ring, a lower PEZ ring, etc. The upper electrode 179 is located opposite to and facing the ESC 177. A work piece 131, e.g., a semiconductor wafer, etc., is supported on an upper surface 183 of the ESC 177. Various processes, e.g., chemical vapor deposition, cleaning, deposition, sputtering, etching, ion implantation, resist stripping, etc., are performed on the work piece 131 during production. Integrated circuits, e.g., application specific integrated circuit (ASIC), programmable logic device (PLD), etc. are developed on the work piece 131 and the integrated circuits are used in a variety of electronic items, e.g., cell phones, tablets, smart phones, computers, laptops, networking equipment, etc. Each of the lower electrode and the upper electrode 179 is made of a metal, e.g., aluminum, alloy of aluminum, copper, etc.

In one embodiment, the upper electrode 179 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 179 is grounded. The ESC 177 is coupled to the x MHz RF generator and the y MHz RF generator via the impedance matching circuit 114.

When the process gas is supplied between the upper electrode 179 and the ESC 177 and when the x MHz RF generator and/or the y MHz RF generator supplies RF signals via the impedance matching circuit 114 and the RF transmission line 113 to the ESC 177, the process gas is ignited to generate plasma within the plasma chamber 175.

When the x MHz RF generator generates and provides an RF signal via the node N3, the impedance matching circuit 114, and the RF transmission line 113 to the ESC 177 and when the y MHz generator generates and provides an RF signal via the node N5, the impedance matching circuit 114, and the RF transmission line 113 to the ESC 177, the VI probe 110 measures the complex voltage and current at the node N3 and the VI probe 111 measures the complex voltage and current at the node N5.

The complex voltages and currents measured by the VI probes 110 and 111 are provided via corresponding communication devices 185 and 189 from the corresponding VI probes 110 and 111 to a storage hardware unit (HU) 162 of a host system 130 for storage. For example, the complex voltage and current measured by the VI probe 110 is provided via the communication device 185 and a cable 191 to the host system 130 and the complex voltage and current measured by the VI probe 111 is provided via the communication device 189 and a cable 193 to the host system 130. Examples of a communication device include an Ethernet device that converts data into Ethernet packets and converts Ethernet packets into data, an Ethernet for Control Automation Technology (EtherCAT) device, a serial interface device that transfers data in series, a parallel interface device that transfers data in parallel, a Universal Serial Bus (USB) interface device, etc.

Examples of the host system 130 include a computer, e.g., a desktop, a laptop, a tablet, etc. As an illustration, the host system 130 includes a processor and the storage HU 162. As used herein, a processor may be a central processing unit (CPU), a microprocessor, an application specific integrated circuit (ASIC), a programmable logic device (PLD), etc. Examples of the storage HU include a read-only memory (ROM), a random access memory (RAM), or a combination thereof. The storage HU may be a flash memory, a redundant array of storage disks (RAID), a hard disk, etc.

The impedance matching model 104 is stored within the storage HU 162. The impedance matching model 104 has similar characteristics, e.g., capacitances, inductances, complex power, complex voltage and currents, etc., as that of the impedance matching circuit 114. For example, the impedance matching model 104 has the same number of capacitors and/or inductors as that within the impedance matching circuit 114, and the capacitors and/or inductors are connected with each other in the same manner, e.g., serial, parallel, etc. as that within the impedance matching circuit 114. To provide an illustration, when the impedance matching circuit 114 includes a capacitor coupled in series with an inductor, the impedance matching model 104 also includes the capacitor coupled in series with the inductor.

As an example, the impedance matching circuit 114 includes one or more electrical components and the impedance matching model 104 includes a design, e.g., a computer-generated model, of the impedance matching circuit 114. The computer-generated model may be generated by a processor based upon input signals received from a user via an input hardware unit. The input signals include signals regarding which electrical components, e.g., capacitors, inductors, etc., to include in a model and a manner, e.g., series, parallel, etc., of coupling the electrical components with each other. As another example, the impedance circuit 114 includes hardware electrical components and hardware connections between the electrical components and the impedance matching model 104 include software representations of the hardware electrical components and of the hardware connections. As yet another example, the impedance matching model 104 is designed using a software program and the impedance matching circuit 114 is made on a printed circuit board. As used herein, electrical components may include resistors, capacitors, inductors, connections between the resistors, connections between the inductors, connections between the capacitors, and/or connections between a combination of the resistors, inductors, and capacitors.

Similarly, a cable model 163 and the cable 150 have similar characteristics, and a cable model 165 and the cable 152 has similar characteristics. As an example, an inductance of the cable model 163 is the same as an inductance of the cable 150. As another example, the cable model 163 is a computer-generated model of the cable 150 and the cable model 165 is a computer-generated model of the cable 152. Similarly, an RF transmission model 161 and the RF transmission line 113 have similar characteristics. For example, the RF transmission model 161 has the same number of capacitors and/or inductors as that within the RF transmission line 113, and the capacitors and/or inductors are connected with each other in the same manner, e.g., serial, parallel, etc. as that within the RF transmission line 113. To further illustrate, when the RF transmission line 113 includes a capacitor coupled in parallel with an inductor, the RF transmission model 161 also includes the capacitor coupled in parallel with the inductor. As yet another example, the RF transmission line 113 includes one or more electrical components and the RF transmission model 161 includes a design, e.g., a computer-generated model, of the RF transmission line 113.

Based on the complex voltage and current received from the VI probe 110 via the cable 191 and characteristics, e.g., capacitances, inductances, etc., of elements, e.g., inductors, capacitors, etc., within the impedance matching model 104, the processor of the host system 130 calculates a complex voltage and current V, I, and ϕ, e.g., a second complex voltage and current, at the output, e.g., the model node N4m, of the impedance matching model 104. The complex voltage and current at the model node N4m is stored in the storage HU 162 and/or another storage HU, e.g., a compact disc, a flash memory, etc., of the host system 130. The complex V, I, and ϕ includes a voltage magnitude V, a current magnitude I, and a phase ϕ between the voltage and current.

The output of the impedance matching model 104 is coupled to an input of the RF transmission model 161, which is stored in the storage hardware unit 162. The impedance matching model 104 also has an input, e.g., a node N3m, which is used to receive the complex voltage and current measured at the node N3.

The RF transmission model 161 includes the portion 173, another portion 197, and an output N2m. An input of the portion 173 is the input of the RF transmission model 161. An output of the portion 173 is coupled to an input of the portion 197. The portion 173 has similar characteristics as that of the portion 169 and the portion 197 has similar characteristics as that of the portion 195.

Based on the complex voltage and current measured at the model node N4m, the processor of the host system 130 calculates a complex voltage and current V, I, and ϕ, e.g., a third complex voltage and current, at the output, e.g., the model node N1m, of the portion 173 of the RF transmission model 161. The complex voltage and current determined at the model node N1m is stored in the storage HU 162 and/or another storage HU, e.g., a compact disc, a flash memory, etc., of the host system 130.

In several embodiments, instead of or in addition to determining the third complex voltage and current, the processor of the host system 130 computes a complex voltage and current, e.g., an intermediate complex voltage and current V, I, and ϕ, at a point, e.g., a node, etc., within the portion 173 based on the complex voltage and current at the output of the impedance matching model 104 and characteristics of elements between the input of the RF transmission model 161 and the point within the portion 173.

In various embodiments, instead of or in addition to determining the third complex voltage and current, the processor of the host system 130 computes a complex voltage and current, e.g., an intermediate complex voltage and current V, I, and ϕ, at a point, e.g., a node, etc., within the portion 197 based on the complex voltage and current at the output of the impedance matching model 104 and characteristics of elements between the input of the RF transmission model 161 and the point within the portion 197.

It should further be noted that in some embodiments, the complex voltage and current at the output of the impedance matching model 104 is calculated based on the complex voltage and current at the output of the x MHz RF generator, characteristics of elements the cable model 163, and characteristics of the impedance matching model 104.

It should be noted that although two generators are shown coupled to the impedance matching circuit 114, in one embodiment, any number of RF generators, e.g., a single generator, three generators, etc., are coupled to the plasma chamber 175 via an impedance matching circuit. For example, a 2 MHz generator, a 27 MHz generator, and a 60 MHz generator may be coupled to the plasma chamber 175 via an impedance matching circuit. For example, although the above-described embodiments are described with respect to using complex voltage and current measured at the node N3, in various embodiments, the above-described embodiments may also use the complex voltage and current measured at the node N5.

Figure 2:
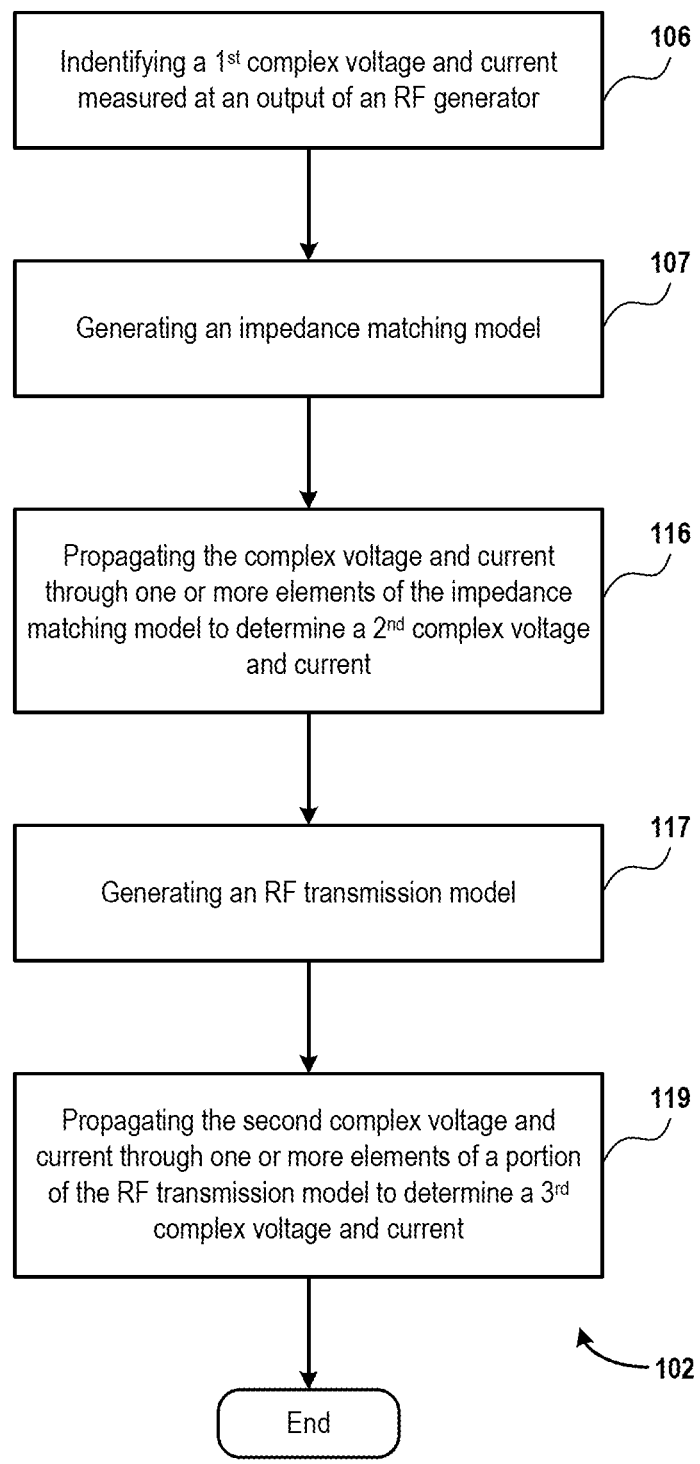
FIG. 2 is a flowchart of a method for determining a complex voltage and current at the output of the RF transmission model portion, in accordance with an embodiment described in the present disclosure.

FIG. 2 is a flowchart of an embodiment of a method 102 for determining the complex voltage and current at the output of the RF transmission model portion 173 (FIG. 1). The method 102 is executed by one or more processors of the host system 130 (FIG. 1). In an operation 106, the complex voltage and current, e.g., the first complex voltage and current, measured at the node N3 is identified from within the storage HU 162 (FIG. 1). For example, it is determined that the first complex voltage and current is received from the voltage probe 110 (FIG. 1). As another example, based on an identity, of the voltage probe 110, stored within the storage HU 162 (FIG. 1), it is determined that the first complex voltage and current is associated with the identity.

Furthermore, in an operation 107, the impedance matching model 104 (FIG. 1) is generated based on electrical components of the impedance matching circuit 114 (FIG. 1). For example, connections between electrical components of the impedance matching circuit 114 and characteristics of the electrical components are provided to the processor of the host system 130 by the user via an input device that is coupled with the host system 130. Upon receiving the connections and the characteristics, the processor generates elements that have the same characteristics as that of electrical components of the impedance matching circuit 114 and generates connections between the elements that have the same connections as that between the electrical components.

The input, e.g., the node N3m, of the impedance matching model 104 receives the first complex voltage and current. For example, the processor of the host system 130 accesses, e.g., reads, etc., from the storage HU 162 the first complex voltage and current and provides the first complex voltage and current to the input of the impedance matching model 104 to process the first complex voltage and current.

In an operation 116, the first complex voltage and current is propagated through one or more elements of the impedance matching model 104 (FIG. 1) from the input, e.g., the node N3m (FIG. 1), of the impedance matching model 104 to the output, e.g., the node N4m (FIG. 1), of the impedance matching model 104 to determine the second complex voltage and current, which is at the output of the impedance matching model 104. For example, with reference to FIG. 3B, when the 2 MHz RF generator is on, e.g., operational, powered on, etc., a complex voltage and current Vx1, Ix1, and ϕx1, e.g., an intermediate complex voltage and current, which includes the voltage magnitude Vx1, the current magnitude Ix1, and the phase ϕx1 between the complex voltage and current, at a node 251, e.g., an intermediate node, is determined based on a capacitance of a capacitor 253, based on a capacitance of a capacitor C5, and based on the first complex voltage and current that is received at an input 255. Moreover, a complex voltage and current Vx2, Ix2, and ϕx2 at a node 257 is determined based on the complex voltage and current Vx1, Ix1, and ϕx1, and based on an inductance of an inductor L3. The complex voltage and current Vx2, Ix2, and ϕx2 includes the voltage magnitude Vx2, the current magnitude Ix2, and the phase ϕx2 between the voltage and current. When the 27 MHz RF generator and the 60 MHz RF generator are off, e.g., nonoperational, powered off, etc., a complex voltage and current V2, I2, and ϕ2 is determined to be the second complex voltage and current at an output 259, which is an example of the output, e.g., the model node N4m (FIG. 1), of the impedance matching model 104 (FIG. 1). The complex voltage and current V2, I2, and ϕ2 is determined based on the complex voltage and current Vx2, Ix2, and ϕx2 and an inductor of an inductor L2. The complex voltage and current V2, I2, and ϕ2 includes the voltage magnitude V2, the current magnitude I2, and the phase ϕ2 between the voltage and current.

Similarly, when 27 MHz RF generator is on and the 2 MHz and the 60 MHz RF generators are off, a complex voltage and current V27, I27, and φ27 at the output 259 is determined based on a complex voltage and current received at a node 261 and characteristics of an inductor LPF2, a capacitor C3, a capacitor C4, and an inductor L2. The complex voltage and current V27, I27, and φ27 includes the voltage magnitude V27, the current magnitude I27, and the phase φ27 between the voltage and current. The complex voltage and current received at the node 261 is the same as the complex voltage and current measured at the node N5 (FIG. 1). When both the 2 MHz and 27 MHz RF generators are on and the 60 MHz RF generator is off, the complex voltages and currents V2, I2, φ2, V27, I27, and φ27 are an example of the second complex voltage and current. Moreover, similarly, when the 60 MHz RF generator is on and the 2 and 27 MHz RF generators are off, a complex voltage and current V60, I60, and φ60 at the output 259 is determined based on a complex voltage and current received at a node 265 and characteristics of an inductor LPF1, a capacitor C1, a capacitor C2, an inductor L4, a capacitor 269, and an inductor L1. The complex voltage and current V60, I60, and φ60 includes the voltage magnitude V60, the current magnitude I60, and the phase φ60 between the voltage and current. When the 2 MHz, 27 MHz, and the 60 MHz RF generators are on, the complex voltages and currents V2, I2, φ2, V27, I27, φ27, V60, I60, and φ60 are an example of the second complex voltage and current.

In an operation 117, the RF transmission model 161 (FIG. 1) is generated based on the electrical components of the RF transmission line 113 (FIG. 1). For example, connections between electrical components of the RF transmission line 113 and characteristics of the electrical components are provided to the processor of the host system 130 by the user via an input device that is coupled with the host system 130. Upon receiving the connections and the characteristics, the processor generates elements that have the same characteristics as that of electrical components of the RF transmission line 113 and generates connections between the elements that are the same as that between the electrical components.

In an operation 119, the second complex voltage and current is propagated through one or more elements of the RF transmission model portion 173 from the input of the RF transmission model portion 173 to the output, e.g., the model node N1m (FIG. 1), of the RF transmission model portion 173 to determine the third complex voltage and current at the output of the RF transmission model portion 173. For example, with reference to FIG. 5B, when the 2 MHz RF generator is on and the 27 and 60 MHz RF generators are off, a complex voltage and current Vx4, Ix4, and φx4, e.g., an intermediate complex voltage and current, at a node 293, e.g., an intermediate node, is determined based on an inductance of an inductor Ltunnel, based on a capacitance of a capacitor Ctunnel, and based on the complex voltage and current V2, I2, and φ2 (FIG. 3B), which is an example of the second complex voltage and current. It should be noted that Ltunnel is an inductance of a computer-generated model of an RF tunnel and Ctunnel is a capacitance of the RF tunnel model. Moreover, a complex voltage and current V21, I21, and φ21 at an output 297 of a tunnel and strap model 210 is determined based on the complex voltage and current Vx4, Ix4, and φx4, and based on an inductance of an inductor Lstrap. The output 297 is an example of the output, e.g., the model node N1m (FIG. 1), of the portion 173 (FIG. 1). It should be noted that Lstrap is an inductance of a computer-generated model of the RF strap. When the 2 MHz RF generator is on and the 27 and 60 MHz RF generators are off, e.g., nonoperational, powered off, etc., the complex voltage and current V21, I21, and φ21 is determined to be the third complex voltage and current at the output 297.

Similarly, when the 27 MHz RF generator is on and the 2 and 60 MHz RF generators are off, a complex voltage and current V271, I271, and φ271 at the output 297 is determined based on the complex voltage and current V27, I27, φ27 (FIG. 3B) at the output 259 and characteristics of the inductor Ltunnel, the capacitor Ctunnel, and the inductor Lstrap. When both the 2 MHz and 27 MHz RF generators are on and the 60 MHz RF generator is off, the complex voltages and currents V21, I21, φ21, V271, I271, and φ271 are an example of the third complex voltage and current.

Moreover, similarly, when the 60 MHz RF generator is powered on and the 2 and 27 MHz RF generators are powered off, a complex voltage and current V601, I601, and φ601 at the output 297 is determined based on the complex voltage and current V60, I60, and φ60 (FIG. 3B) received at a node 259 and characteristics of the inductor Ltunnel, the capacitor Ctunnel, and the inductor Lstrap. When the 2 MHz, 27 MHz, and the 60 MHz RF generators are on, the complex voltages and currents V21, I21, φ21, V271, I271, φ271, V601, I601, and φ601 are an example of the third complex voltage and current. The method 102 ends after the operation 119.

Figure 3A:
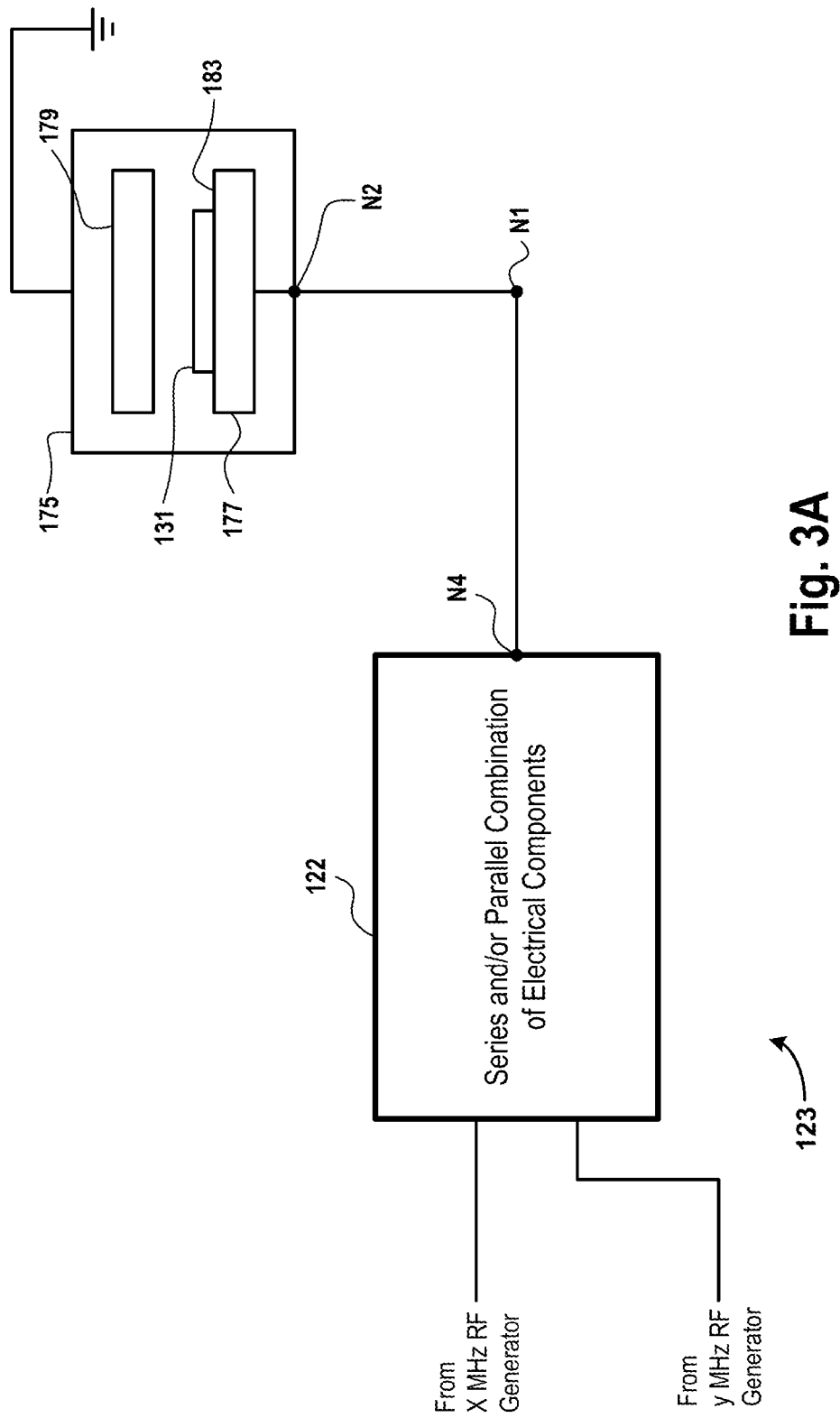
FIG. 3A is a block diagram of a system used to illustrate an impedance matching circuit, in accordance with an embodiment described in the present disclosure.

FIG. 3A is a block diagram of an embodiment of a system 123 used to illustrate an impedance matching circuit 122. The impedance matching circuit 122 is an example of the impedance matching circuit 114 (FIG. 1). The impedance matching circuit 122 includes series connections between electrical components and/or parallel connections between electrical components.

Figure 3B:
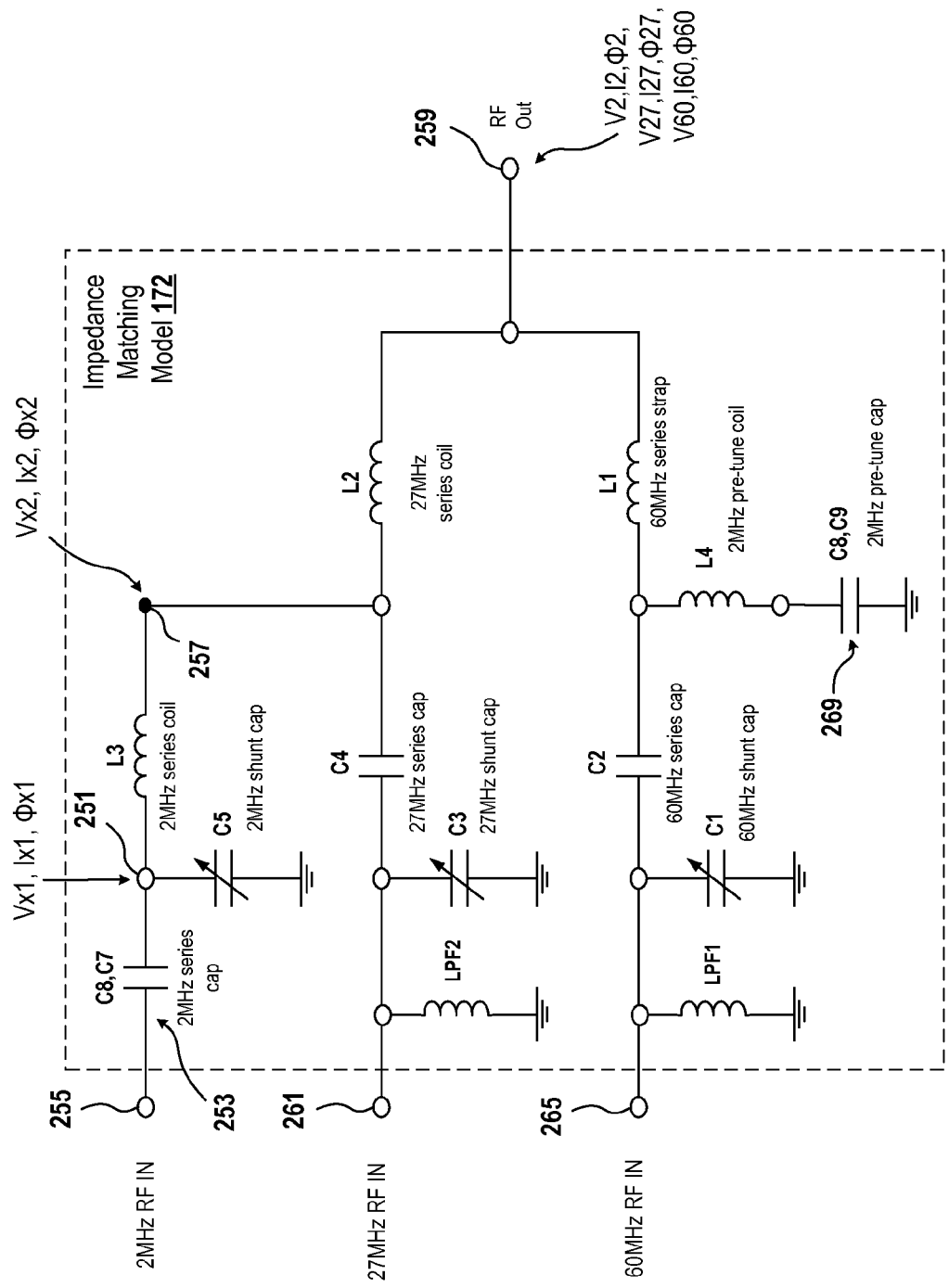
FIG. 3B is a circuit diagram of an impedance matching model, in accordance with an embodiment described in the present disclosure.

FIG. 3B is a circuit diagram of an embodiment of an impedance matching model 172. The impedance matching model 172 is an example of the impedance matching model 104 (FIG. 1). As shown, the impedance matching model 172 includes capacitors having capacitances C1 thru C9, inductors having inductances LPF1, LPF2, and L1 thru L4. It should be noted that the manner in which the inductors and/or capacitors are coupled with each other in FIG. 3B is an example. For example, the inductors and/or capacitors shown in FIG. 3B can be coupled in a series and/or parallel manner with each other. Also, in some embodiments, the impedance matching model 172 includes a different number of capacitors and/or a different number of inductors than that shown in FIG. 3B.

Figure 4:
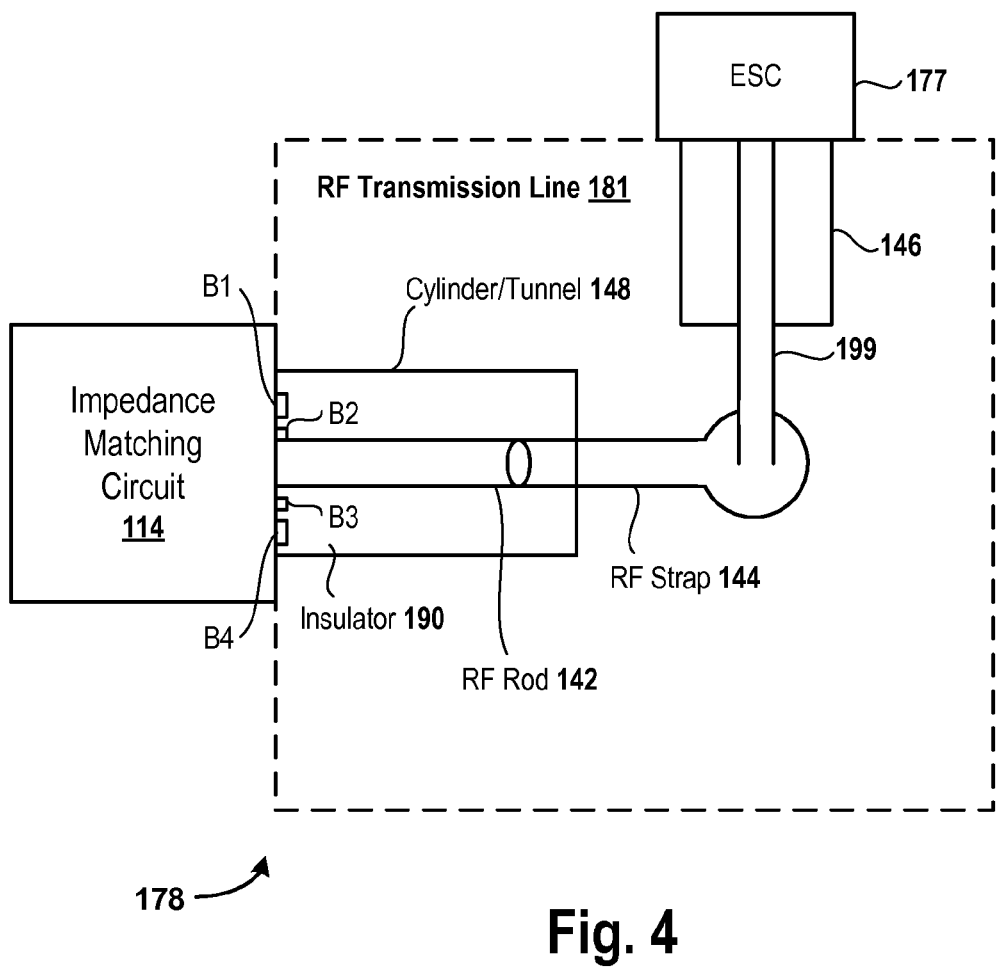
FIG. 4 is a diagram of a system used to illustrate an RF transmission line, in accordance with an embodiment described in the present disclosure.

FIG. 4 is a diagram of an embodiment of a system 178 used to illustrate an RF transmission line 181, which is an example of the RF transmission line 113 (FIG. 1). The RF transmission line 181 includes a cylinder 148, e.g., a tunnel. Within a hollow of the cylinder 148 lies an insulator 190 and an RF rod 142. A combination of the cylinder 148 and the RF rod 142 is an example of the portion 169 (FIG. 1) of the RF transmission line 113 (FIG. 1). The RF transmission line 113 is bolted via bolts B1, B2, B3, and B4 with the impedance matching circuit 114. In one embodiment, the RF transmission line 113 is bolted via any number of bolts with the impedance matching circuit 114. In some embodiments, instead of or in addition to bolts, any other form of attachment, e.g., glue, screws, etc., is used to attach the RF transmission line 113 to the impedance matching circuit 114.

The RF transmission rod 142 is coupled with the output of the impedance matching circuit 114. Also, an RF strap 144, also known as RF spoon, is coupled with the RF rod 142 and an RF rod 199, a portion of which is located within a support 146, e.g., a cylinder. In an embodiment, a combination of the cylinder 148, the RF rod 142, the RF strap 144, the cylinder 146 and the RF rod 199 forms an RF transmission line 181, which is an example of the RF transmission line 113 (FIG. 1). The support 146 provides support to the plasma chamber. The support 146 is attached to the ESC 177 of the plasma chamber. An RF signal is supplied from the x MHz generator via the cable 150, the impedance matching circuit 114, the RF rod 142, the RF strap 144, and the RF rod 199 to the ESC 177.

In one embodiment, the ESC 177 includes a heating element and an electrode on top of the heating element. In an embodiment, the ESC 177 includes a heating element and the lower electrode. In one embodiment, the ESC 177 includes the lower electrode and a heating element, e.g., coil wire, etc., embedded within holes formed within the lower electrode. In some embodiments, the electrode is made of a metal, e.g., aluminum, copper, etc. It should be noted that the RF transmission line 181 supplies an RF signal to the lower electrode of the ESC 177.

Figure 5A:
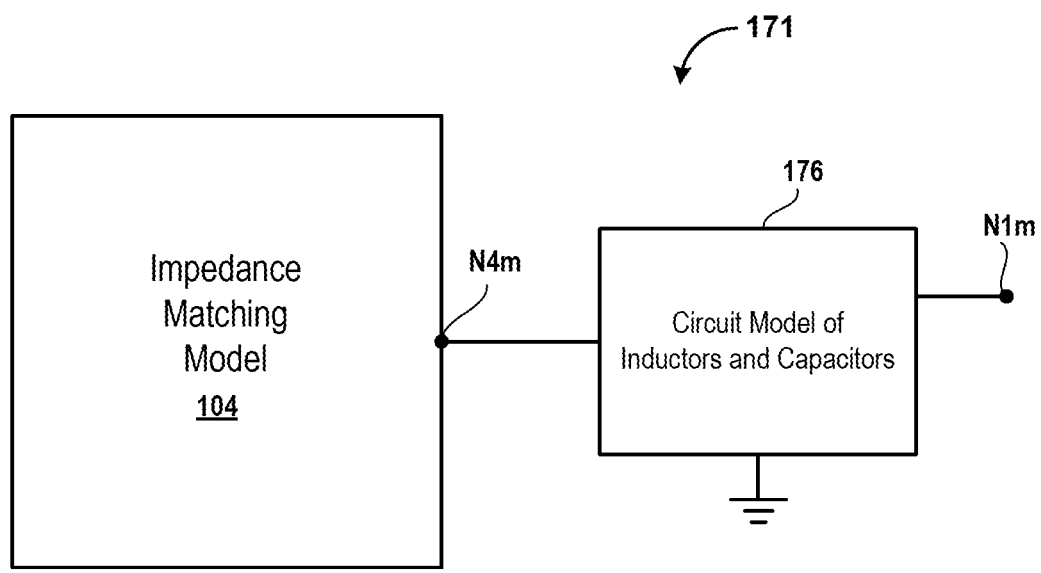
FIG. 5A is a block diagram of a system used to illustrate a circuit model of the RF transmission line, in accordance with an embodiment described in the present disclosure.

FIG. 5A is a block diagram of an embodiment of a system 171 used to illustrate a circuit model 176 of the RF transmission line 113 (FIG. 1). For example, the circuit model 176 includes inductors and/or capacitors, connections between the inductors, connections between the capacitors, and/or connections between the inductors and the capacitors. Examples of connections include series and/or parallel connections. The circuit model 176 is an example of the RF transmission model 161 (FIG. 1).

Figure 5B:
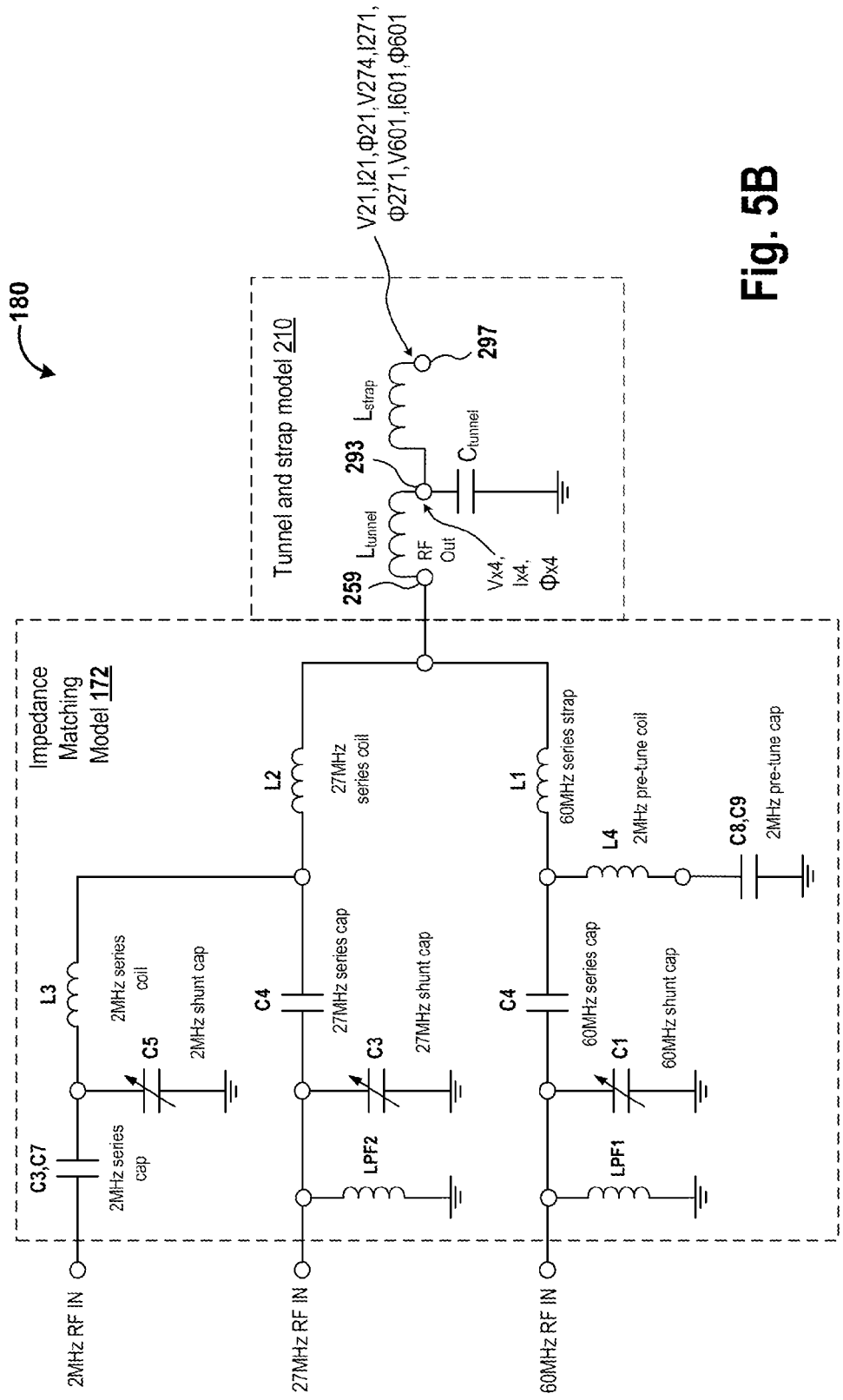
FIG. 5B is a diagram of an electrical circuit used to illustrate a tunnel and strap model of the RF transmission model, in accordance with an embodiment described in the present disclosure.

FIG. 5B is a diagram of an embodiment of an electrical circuit 180 used to illustrate a tunnel and strap model 210, which is an example of the portion 173 (FIG. 1) of the RF transmission model 161 (FIG. 1). The electrical circuit 180 includes the impedance matching model 172 and the tunnel and strap model 210. The tunnel and strap model 210 includes inductors Ltunnel and Lstrap and a capacitor Ctunnel. It should be noted that the inductor Ltunnel represents an inductance of the cylinder 148 (FIG. 4) and the RF rod 142 and the capacitor Ctunnel represents a capacitance of the cylinder 148 and the RF rod 142. Moreover, the inductor Lstrap represents an inductance of the RF strap 144 (FIG. 4).

In an embodiment, the tunnel and strap model 210 includes any number of inductors and/or any number of capacitors. In this embodiment, the tunnel and strap model 210 includes any manner, e.g., serial, parallel, etc. of coupling a capacitor to another capacitor, coupling a capacitor to an inductor, and/or coupling an inductor to another inductor.

Figure 6:
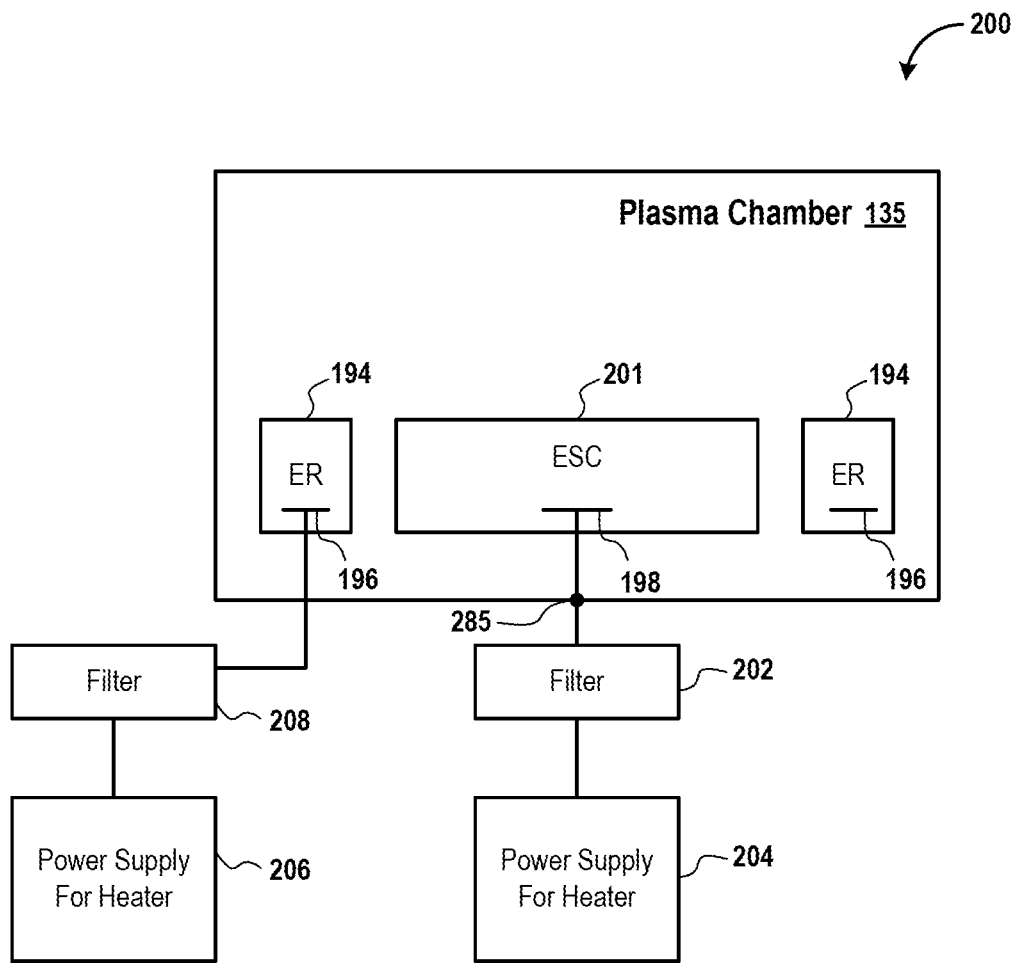
FIG. 6 is a block diagram of a plasma system that includes filters used to determine the variable, in accordance with an embodiment described in the present disclosure.

FIG. 6 is a block diagram of an embodiment of a system 200 for using a variable determined by the method 102 (FIG. 2). The system 200 includes a plasma chamber 135, which further includes an ESC 201 and has an input 285. The plasma chamber 135 is an example of the plasma chamber 175 (FIG. 1) and the ESC 201 is an example of the ESC 177 (FIG. 1). The ESC 201 includes a heating element 198. Also, the ESC 201 is surrounded by an edge ring (ER) 194. The ER 194 includes a heating element 196. In an embodiment, the ER 194 facilitates a uniform etch rate and reduced etch rate drift near an edge of the work piece 131 that is supported by the ESC 201.

A power supply 206 provides power to the heating element 196 via a filter 208 to heat the heating element 196 and a power supply 204 provides power to the heating element 198 via a filter 202 to heat the heating element 198. In an embodiment, a single power supply provides power to both the heating elements 196 and 198. The filter 208 filters out predetermined frequencies of a power signal that is received from the power supply 206 and the filter 202 filters out predetermined frequencies of a power signal that is received from the power supply 204.

The heating element 198 is heated by the power signal received from the power supply 204 to maintain an electrode of the ESC 201 at a desirable temperature to further maintain an environment within the plasma chamber 135 at a desirable temperature. Moreover, the heating element 196 is heated by the power signal received from the power supply 206 to maintain the ER 194 at a desirable temperature to further maintain an environment within the plasma chamber 135 at a desirable temperature.

It should be noted that in an embodiment, the ER 194 and the ESC 201 include any number of heating elements and any type of heating elements. For example, the ESC 201 includes an inductive heating element or a metal plate. In one embodiment, each of the ESC 201 and the ER 194 includes one or more cooling element, e.g., one or more tubes that allow passage of cold water, etc., to maintain the plasma chamber 135 at a desirable temperature.

It should further be noted that in one embodiment, the system 200 includes any number of filters. For example, the power supplies 204 and 206 are coupled to the ESC 201 and the ER 194 via a single filter.

FIG. 7A is a diagram of an embodiment of a system 217 used to illustrate a model of the filters 202 and 208 (FIG. 6) to improve an accuracy of the variable. The system 217 includes the tunnel and strap model 210 that is coupled to a model 216, which includes capacitors and/or inductors, and connections therebetween of the filters 202 and 208. The model 216 is stored within the storage HU 162 (FIG. 1) and/or the other storage HU. The capacitors and/or inductors of the model 216 are coupled with each other in a manner, e.g., a parallel manner, a serial manner, a combination thereof, etc. The model 216 represents capacitances and/or inductances of the filters 202 and 208.

Moreover, the system 217 includes a cylinder model 211, which is a computer-generated model of the RF rod 199 (FIG. 4) and the support 146 (FIG. 4). The cylinder model 211 has similar characteristics as that of electrical components of the RF rod 199 and the support 146. The cylinder model 211 includes one or more capacitors, one or more inductors, connections between the inductors, connections between the capacitors, and/or connections between a combination of the capacitors and inductors.

The processor of the host system 130 (FIG. 1) calculates a combined impedance, e.g., total impedance, etc., of the model 216, the tunnel and strap model 210, and the cylinder model 211. The combined impedance provides a complex voltage and impedance at the node N2m. With the inclusion of the model 216 and the tunnel and strap model 210 in determining the variable at the node N2m, accuracy of the variable is improved. It should be noted that an output of the model 216 is the model node N2m.

FIG. 7B is a diagram of an embodiment of a system 219 used to illustrate a model of the filters 202 and 208 (FIG. 6) to improve an accuracy of the variable. The system 219 includes the tunnel and strap model 210 and a model 218, which is coupled in parallel to the tunnel and strap model 210. The model 218 is an example of the model 216 (FIG. 7A). The model 218 includes an inductor Lfilter, which represents a combined inductance of the filters 202 and 208. The model 218 further includes a capacitor Cfilter, which represents directed combined capacitance of the filters 202 and 208.

Figure 8:
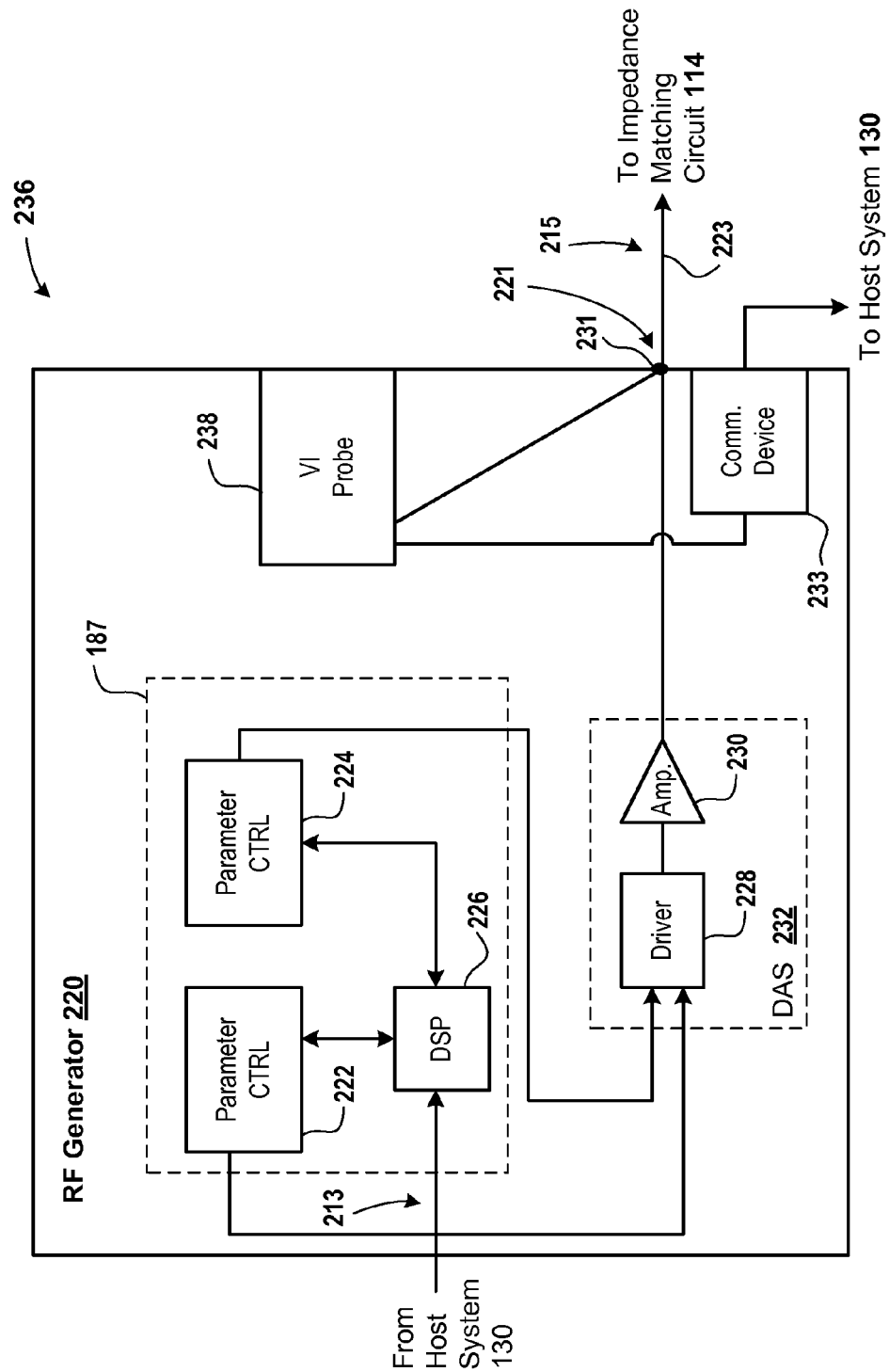
FIG. 8 is a block diagram of a system for using a current and voltage (VI) probe to measure the variable at an output of an RF generator of the system of FIG. 1, in accordance with one embodiment described in the present disclosure.

FIG. 8 is a block diagram of an embodiment of a system 236 for using a VI probe 238 to measure the variable at an output 231 of an RF generator 220. The output 231 is an example of the node N3 (FIG. 1) or of the node N5 (FIG. 1). The RF generator 220 is an example of the x MHz generator or the y MHz generator (FIG. 1). The host system 130 generates and provides a digital pulsing signal 213 having two or more states to a digital signal processor (DSP) 226. In one embodiment, the digital pulsing signal 213 is a transistor-transistor logic (TTL) signal. Examples of the states include an on state and an off state, a state having a digital value of 1 and a state having a digital value of 0, a high state and a low state, etc.

In another embodiment, instead of the host system 130, a clock oscillator, e.g., a crystal oscillator, is used to generate an analog clock signal, which is converted by an analog-to-digital converter into a digital signal similar to the digital pulsing signal 213.

The digital pulsing signal 213 is sent to the DSP 226. The DSP 226 receives the digital pulsing signal 213 and identifies the states of the digital pulsing signal 213. For example, the DSP 226 determines that the digital pulsing signal 213 has a first magnitude, e.g., the value of 1, the high state magnitude, etc., during a first set of time periods and has a second magnitude, e.g., the value of 0, the low state magnitude, etc., during a second set of time periods. The DSP 226 determines that the digital pulsing signal 213 has a state S1 during the first set of time periods and has a state S0 during the second set of time periods. Examples of the state S0 include the low state, the state having the value of 0, and the off state. Examples of the state S1 include the high state, the state having the value of 1, and the on state. As yet another example, the DSP 226 compares a magnitude of the digital pulsing signal 213 with a pre-stored value to determine that the magnitude of the digital pulsing signal 213 is greater than the pre-stored value during the first set of time periods and that the magnitude during the state S0 of the digital pulsing signal 213 is not greater than the pre-stored value during the second set of time periods. In the embodiment in which the clock oscillator is used, the DSP 226 receives an analog clock signal from the clock oscillator, converts the analog signal into a digital form, and then identifies the two states S0 and S1.

When a state is identified as S1, the DSP 226 provides a power value P1 and/or a frequency value F1 to a parameter control 222. Moreover, when the state is identified as S0, the DSP 226 provides a power value P0 and/or a frequency value F0 to a parameter control 224. An example of a parameter control that is used to tune a frequency includes an auto frequency tuner (AFT).

It should be noted that the parameter control 222, the parameter control 224, and the DSP 226 are portions of a control system 187. For example, the parameter control 222 and the parameter control 224 are logic blocks, e.g., tuning loops, which are portions of a computer program that is executed by the DSP 226. In some embodiments, the computer program is embodied within a non-transitory computer-readable medium, e.g., a storage HU.

In an embodiment, a controller, e.g., hardware controller, ASIC, PLD, etc., is used instead of a parameter control. For example, a hardware controller is used instead of the parameter control 222 and another hardware controller is used instead of the parameter control 224.

Upon receiving the power value P1 and/or the frequency value F1, the parameter control 222 provides the power value P1 and/or the frequency value F1 to a driver 228 of a drive and amplifier system (DAS) 232. Examples of a driver includes a power driver, a current driver, a voltage driver, a transistor, etc. The driver 228 generates an RF signal having the power value P1 and/or the frequency value F1 and provides the RF signal to an amplifier 230 of the DAS 232.

In one embodiment, the driver 228 generates an RF signal having a drive power value that is a function of the power value P1 and/or having a drive frequency value that is a function of the frequency value F1. For example, the drive power value is within a few, e.g. 1 thru 5, watts of the power value P1 and the drive frequency value is within a few, e.g. 1 thru 5, Hz of the frequency value F1.

The amplifier 230 amplifies the RF signal having the power value P1 and/or the frequency value F1 and generates an RF signal 215 that corresponds to the RF signal received from the driver 228. For example, the RF signal 215 has a higher amount of power than that of the power value P1. As another example, the RF signal 215 has the same amount of power as that of the power value P1. The RF signal 215 is transferred via a cable 223 and the impedance matching circuit 114 to the known load.

The cable 223 is an example of the cable 150 or the cable 152 (FIG. 1). For example, when the RF generator 220 is an example of the x MHz RF generator (FIG. 1), the cable 223 is an example of the cable 150 and when the RF generator 220 is an example of the y MHz RF generator (FIG. 1), the cable 223 is an example of the cable 152.

When the power value P1 and/or the frequency value F1 are provided to the DAS 232 by the parameter control 222 and the RF signal 215 is generated, a VI probe 238 measures values of the variable at the output 231 that is coupled to the cable 223. The VI probe 238 is an example of the VI probe 110 or the VI probe 111 (FIG. 1). The VI probe 238 sends the values of the variable via a communication device 233 to the host system 130 for the host system 130 to execute the method 102 (FIG. 2) and other methods described herein. The communication device 233 is an example of the communication device 185 or 189 (FIG. 1). The communication device 233 applies a protocol, e.g., Ethernet, EtherCAT, USB, serial, parallel, packetization, depacketization, etc., to transfer data from the VI probe 238 to the host system 130. In various embodiments, the host system 130 includes a communication device that applies the protocol applied by the communication device 233. For example, when the communication 233 applies packetization, the communication device of the host system 130 applies depacketization. As another example, when the communication 233 applies a serial transfer protocol, the communication device of the host system 130 applies a serial transfer protocol.

Similarly, upon receiving the power value P0 and/or the frequency value F0, the parameter control 224 provides the power value P0 and/or the frequency value F0 to the driver 228. The driver 228 creates an RF signal having the power value P0 and/or the frequency value F0 and provides the RF signal to the amplifier 230.

In one embodiment, the driver 228 generates an RF signal having a drive power value that is a function of the power value P0 and/or having a drive frequency value that is a function of the frequency value F0. For example, the drive power value is within a few, e.g. 1 thru 5, watts of the power value P0 and the drive frequency value is within a few, e.g. 1 thru 5, Hz of the frequency value F0.

The amplifier 230 amplifies the RF signal having the power value P0 and/or the frequency value F0 and generates an RF signal 221 that corresponds to the RF signal received from the driver 228. For example, the RF signal 221 has a higher amount of power than that of the power value P0. As another example, the RF signal 221 has the same amount of power as that of the power value P0. The RF signal 221 is transferred via the cable 223 and the impedance matching circuit 114 to the known load.

When the power value P0 and/or the frequency value F0 are provided to the DAS 232 by the parameter control 224 and the RF signal 221 is generated, the VI probe 238 measures values of the variable at the output 231. The VI probe 238 sends the values of the variable to the host system 130 for the host system 130 to execute the method 102 (FIG. 2).

It should be noted that the in one embodiment, the VI probe 238 is decoupled from the DSP 226. It should further be noted that the RF signal 215 generated during the state S1 and the RF signal 221 generated during the state S0 are portions of a combined RF signal. For example, the RF signal 215 is a portion of the combined RF signal that has a higher amount of power than the RF signal 221, which is another portion of the combined RF signal.

Figure 9:
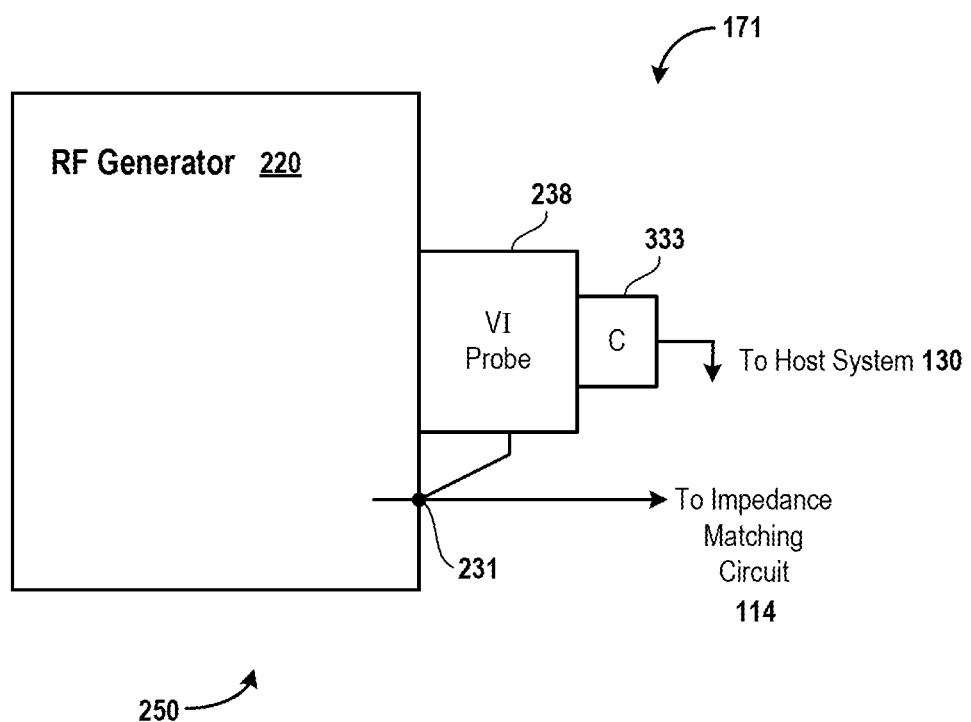
FIG. 9 is a block diagram of a system in which the VI probe and a communication device are located outside the RF generator, in accordance with an embodiment described in the present disclosure.

FIG. 9 is a block diagram of an embodiment of a system 250 in which the VI probe 238 and the communication device 233 are located outside the RF generator 220. In FIG. 1, the VI probe 110 is located within the x MHz RF generator to measure the variable at the output of the x MHz RF generator. The VI probe 238 is located outside the RF generator 220 to measure the variable at the output 231 of the RF generator 220. The VI probe 238 is associated, e.g., coupled, to the output 231 of the RF generator 220.

Figure 10:
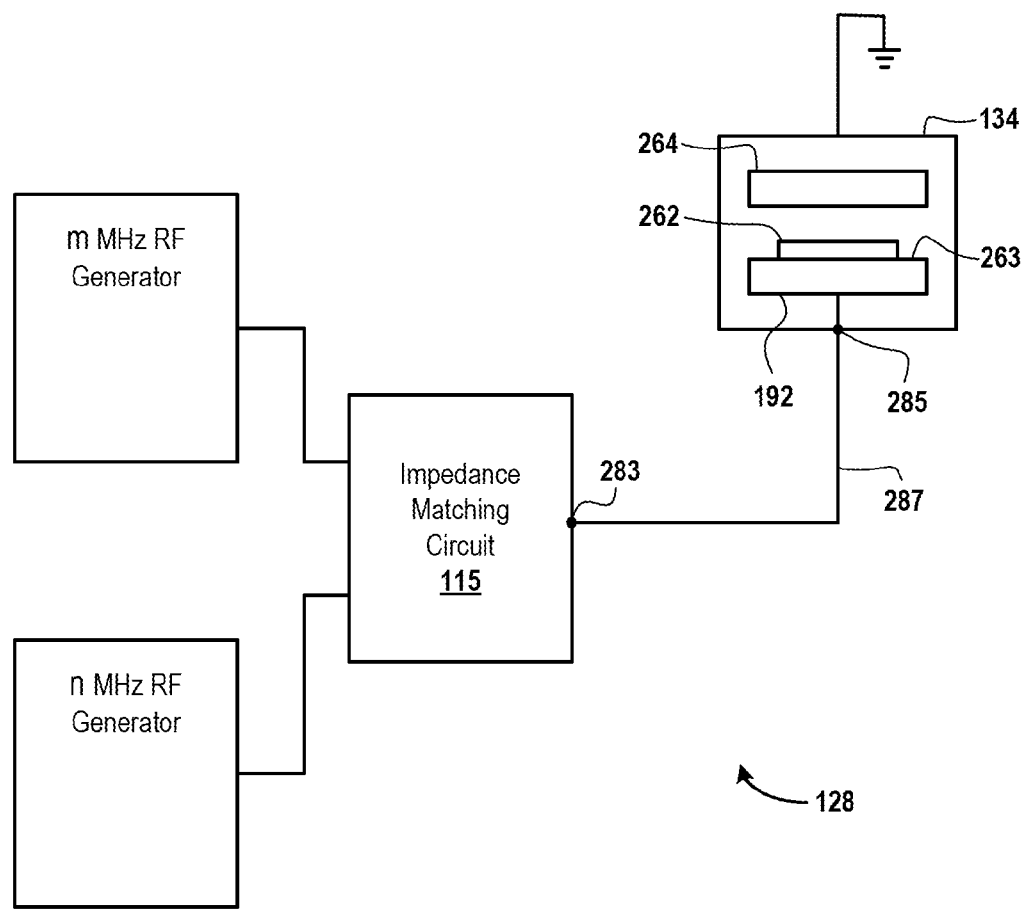
FIG. 10 is a block diagram of an embodiment of a system in which values of the variable determined using the system of FIG. 1 are used, in accordance with an embodiment described in the present disclosure.

FIG. 10 is a block diagram of an embodiment of a system 128 in which the values of the variable determined using the system 126 of FIG. 1 are used. The system 128 includes an m MHz RF generator, an n MHz RF generator, an impedance matching circuit 115, an RF transmission line 287, and a plasma chamber 134. The plasma chamber 134 may be similar to the plasma chamber 175.

It should be noted that in an embodiment, the x MHz RF generator of FIG. 1 is similar to the m MHz RF generator and the y MHz RF generator of FIG. 1 is similar to the n MHz RF generator. As an example, x MHz is equal to m MHz and y MHz is equal to n MHz. As another example, the x MHz generator and the m MHz generators have similar frequencies and the y MHz generator and the n MHz generator have similar frequencies. An example of similar frequencies is when the x MHz is within a window, e.g., within kHz or Hz, of the m MHz frequency. In some embodiments, the x MHz RF generator of FIG. 1 is not similar to the m MHz RF generator and the y MHz RF generator of FIG. 1 is not similar to the n MHz RF generator.

It is further noted that in various embodiments, a different type of sensor is used in each of the m MHz and n MHz RF generators than that used in each of the x MHz and y MHz RF generators. For example, a sensor that does not comply with the NIST standard is used in the m MHz RF generator. As another example, a voltage sensor that measures only voltage is used in the m MHz RF generator.

It should further be noted that in an embodiment, the impedance matching circuit 115 is similar to the impedance matching circuit 114 (FIG. 1). For example, an impedance of the impedance matching circuit 114 is the same as an impedance of the impedance matching circuit 115. As another example, an impedance of the impedance matching circuit 115 is within a window, e.g., within 10-20%, of the impedance of the impedance matching circuit 114. In some embodiments, the impedance matching circuit 115 is not similar to the impedance matching circuit 114.

The impedance matching circuit 115 includes electrical components, e.g., inductors, capacitors, etc. to match an impedance of a power source coupled to the impedance matching circuit 115 with an impedance of a load coupled to the circuit 115. For example, the impedance matching circuit 114 matches an impedance of the m MHz and n MHz RF generators with an impedance of the plasma chamber 134. In one embodiment, impedance matching circuit 115 is tuned to facilitate a match between an impedance of m MHz and n MHz RF generators coupled to the impedance matching circuit 115 and an impedance of a load.

It should be noted that in an embodiment, the RF transmission line 287 is similar to the RF transmission line 113 (FIG. 1). For example, an impedance of the RF transmission line 287 is the same as an impedance of the RF transmission line 113. As another example, an impedance of the RF transmission line 287 is within a window, e.g., within 10-20%, of the impedance of the RF transmission line 113. In various embodiments, the RF transmission line 287 is not similar to the RF transmission line 113.

The plasma chamber 134 includes an ESC 192, an upper electrode 264, and other parts (not shown), e.g., an upper dielectric ring surrounding the upper electrode 264, an upper electrode extension surrounding the upper dielectric ring, a lower dielectric ring surrounding a lower electrode of the ESC 192, a lower electrode extension surrounding the lower dielectric ring, an upper plasma exclusion zone (PEZ) ring, a lower PEZ ring, etc. The upper electrode 264 is located opposite to and facing the ESC 192. A work piece 262, e.g., a semiconductor wafer, etc., is supported on an upper surface 263 of the ESC 192. Each of the upper electrode 264 and the lower electrode of the ESC 192 is made of a metal, e.g., aluminum, alloy of aluminum, copper, etc.

In one embodiment, the upper electrode 264 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 264 is grounded. The ESC 192 is coupled to the m MHz RF generator and the n MHz RF generator via the impedance matching circuit 115.

When the process gas is supplied between the upper electrode 264 and the ESC 192 and when the m MHz RF generator or the n MHz RF generator supplies power via the impedance matching circuit 115 to the ESC 192, the process gas is ignited to generate plasma within the plasma chamber 134.

It should be noted that the system 128 lacks a probe, e.g., a metrology tool, a VI probe, a voltage probe, etc., to measure the variable at an output 283 of the impedance matching circuit 115 or at a point on the RF transmission line 287. The values of the variable at the model nodes N1m, N2m, and N4m are used to determine whether the system 128 is functioning as desired.

It should also be noted that in an embodiment, the system 128 includes any number of RF generators coupled to an impedance matching circuit.

Figure 11C:
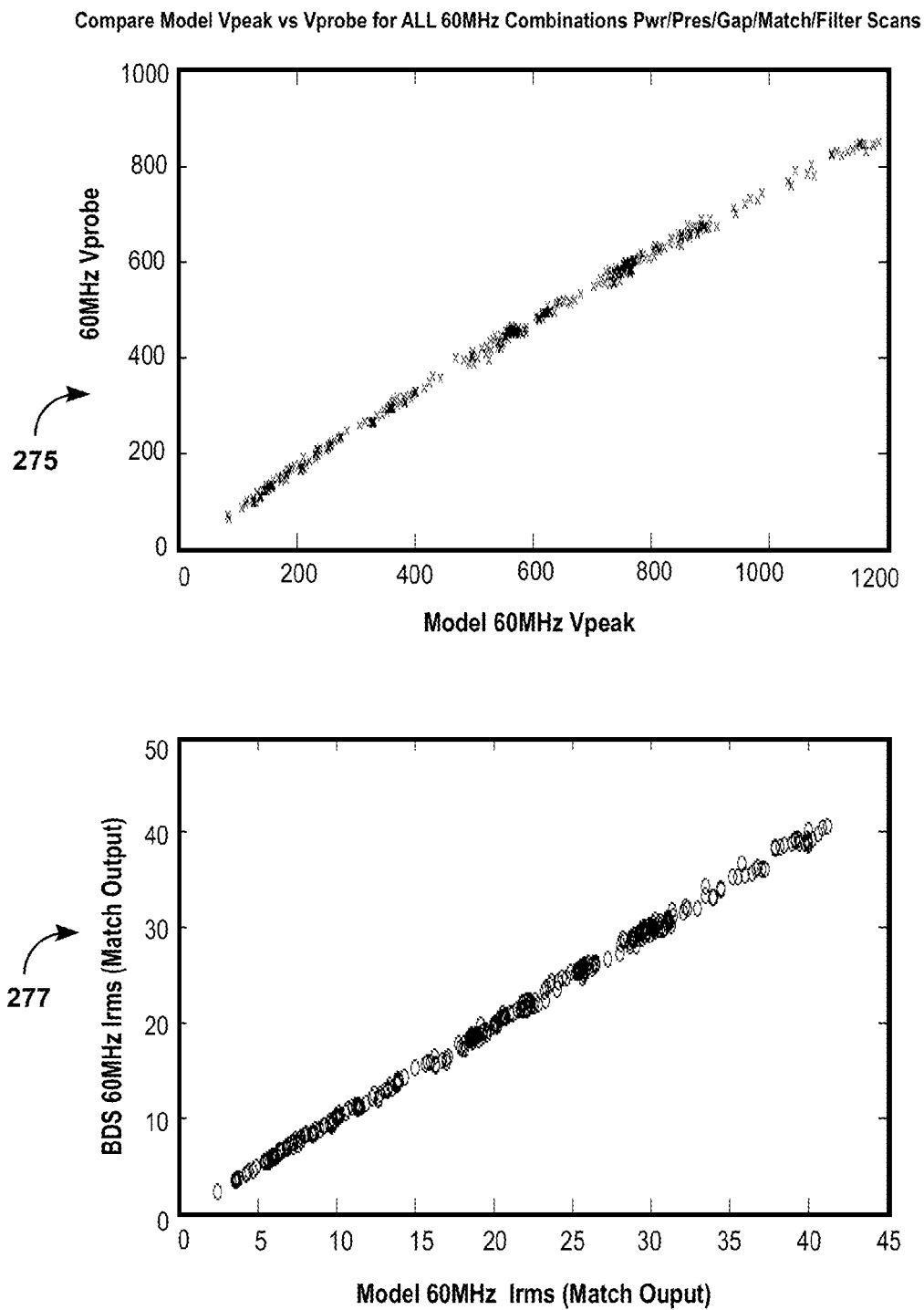
FIG. 11C is a diagram of a graph that illustrates a correlation between voltage that is measured at an output within the system of FIG. 1 by using a voltage probe and a voltage that is determined using the method of FIG. 2 when a z MHz RF generator is operational, in accordance with one embodiment described in the present disclosure.

FIGS. 11A, 11B, and 11C are diagrams of embodiments of graphs 268, 272, and 275 that illustrate a correlation between voltage, e.g., root mean square (RMS) voltage, etc., that is measured at the output, e.g., the node N4, of the impedance matching circuit 114 (FIG. 1) within the system 126 (FIG. 1) by using a voltage probe and a voltage, e.g., peak voltage, etc., at a corresponding model node output, e.g., the node N4m, determined using the method 102 (FIG. 2). Moreover, FIGS. 11A thru 11C are diagrams of embodiments of graphs 270, 274, and 277 that illustrate a correlation between current, e.g., RMS current, etc., that is measured the output, e.g., the node N4, of the system 126 (FIG. 1) by using a current probe and a current, e.g., RMS current, etc., at a corresponding output, e.g., the node N4m, determined using the method 102 (FIG. 2).

The voltage determined using the method 102 is plotted on an x-axis in each graph 268, 272, and 275 and the voltage determined using the voltage probe is plotted on a y-axis in each graph 268, 272, and 275. Similarly, the current determined using the method 102 is plotted on an x-axis in each graph 270, 274, and 277 and the current determined using the current probe is plotted on a y-axis in each graph 270, 274, and 277.

The voltages are plotted in the graph 268 when the x MHz RF generator is operational, e.g., powered on, etc., and the y MHz RF generator and a z MHz RF generator, e.g., 60 MHz RF generator, are nonoperational, e.g., powered off, decoupled from the impedance matching circuit 114, etc. Moreover, the voltages are plotted in the graph 272 when the y MHz RF generator is operational and the x and z MHz RF generators are nonoperational. Also, the voltages are plotted in the graph 275 when the z MHz RF generator is operational and the x and y MHz RF generators are nonoperational.

Similarly, currents are plotted in the graph 270 when the x MHz RF generator is operational, e.g., powered on, etc., and the y MHz RF generator and a z MHz RF generator are nonoperational, e.g., powered off, etc. Also, the currents are plotted in the graph 274 when the y MHz RF generator is operational and the x and z MHz RF generators are nonoperational. Also, the currents are plotted in the graph 277 when the z MHz RF generator is operational and the x and y MHz RF generators are nonoperational.

It can be seen in each graph 268, 272, and 275 that an approximately linear correlation exists between the voltage plotted on the y-axis of the graph and the voltage plotted on the x-axis of the graph. Similarly, it can be seen in each graph 270, 274, and 277 that an approximately linear correlation exists between the current plotted on the y-axis and the current plotted on the x-axis.

Figure 12A:
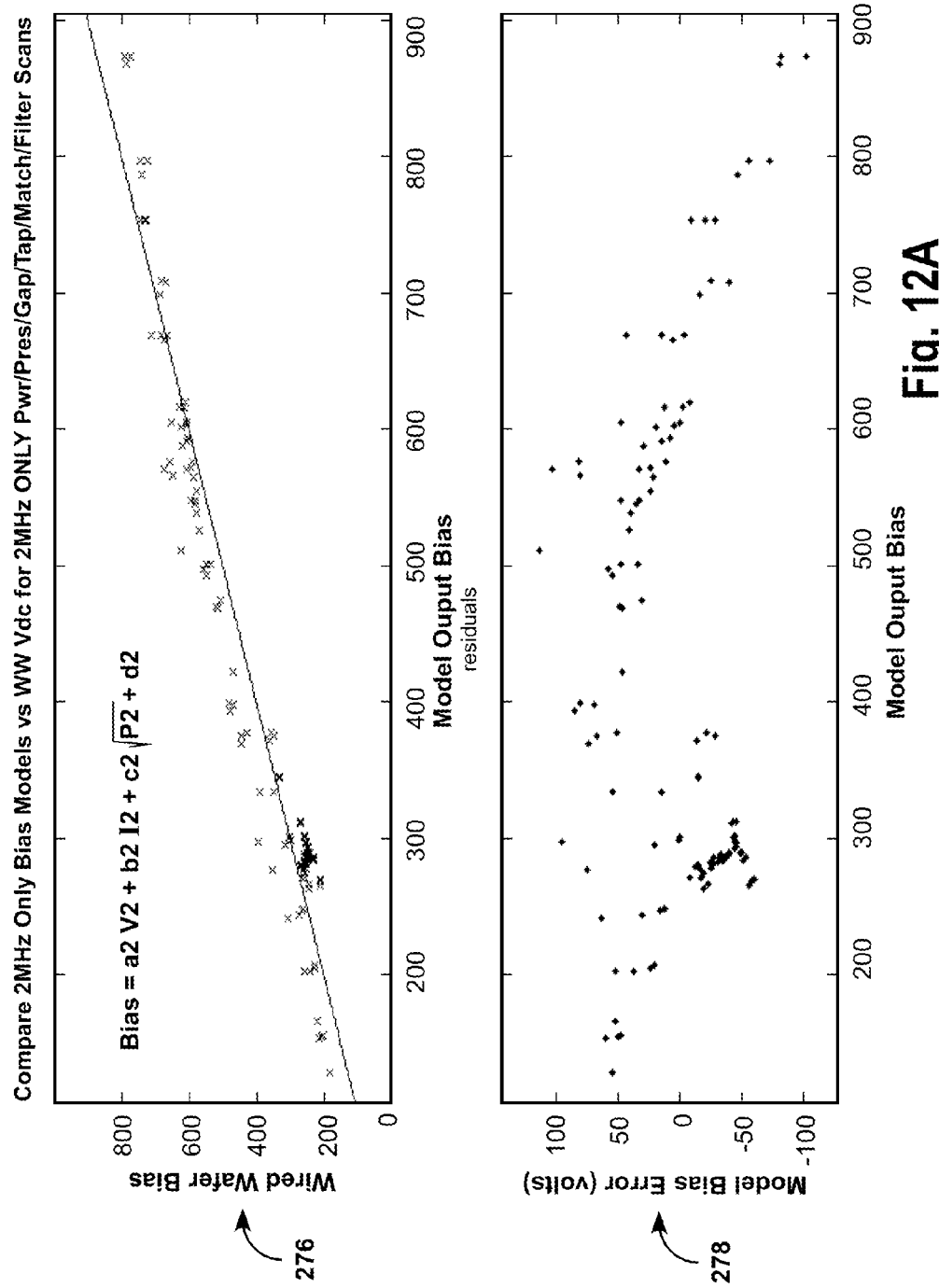
FIG. 12A is a diagram of graphs used to illustrate a correlation between a wired wafer bias measured using a sensor tool, a model bias that is determined using the method of FIG. 2 and using a mathematical conversion, and an error in the model bias when the x MHz RF generator is operational, in accordance with an embodiment described in the present disclosure.

FIG. 12A is a diagram of an embodiment of graphs 276 and 278 to illustrate that there is a correlation between a wired wafer bias measured using a sensor tool, e.g., a metrology tool, a probe, a sensor, etc., a model bias that is determined using the method 102 (FIG. 2) and a mathematical conversion, e.g., an equation, a formula, etc., and an error in the model bias The wired wafer bias that is plotted in the graph 276 is measured at a point, e.g., a node, on the RF transmission line 113, e.g., the node N1, the node N2, etc., of the system 126 (FIG. 1) and the model bias that is plotted in the graph 276 is determined at the corresponding model point, e.g., the model node N1m, the model node N2m, etc. (FIG. 1), on the RF transmission model 161 (FIG. 1). The wired wafer bias is plotted along a y-axis in the graph 276 and the model bias is plotted along an x-axis in the graph 276.

The wired wafer bias and the model bias are plotted in the graph 276 when the x MHz RF generator is operational, and the y and z MHz RF generators are nonoperational. Moreover, the model bias of graph 276 is determined using an equation $a2*V2+b2*I2+c2*sqrt(P2)+d2$, where "*" represents multiplication, sqrt represents a square root, "V2" represents voltage at an output of the impedance matching model 104, I2 represents current at the output of the impedance matching model 104, P2 represents power at the output of the impedance matching model 104, "a2" is a coefficient, "b2" is a coefficient, "c2" is a coefficient, and "d2" is a constant value.

The graph 278 plots an error, which is an error at a model node on the RF transmission line model 161 (FIG. 1), e.g., at the node N1m, at the node N2m, etc. (FIG. 1), on a y-axis and plots the model bias at the model point on an x-axis. The model error is an error, e.g., a variance, a standard deviation, etc., in the model bias. The model error and the model bias are plotted in the graph 278 when the x MHz RF generator is operational and the y and z MHz RF generators are nonoperational.

Figure 12B:
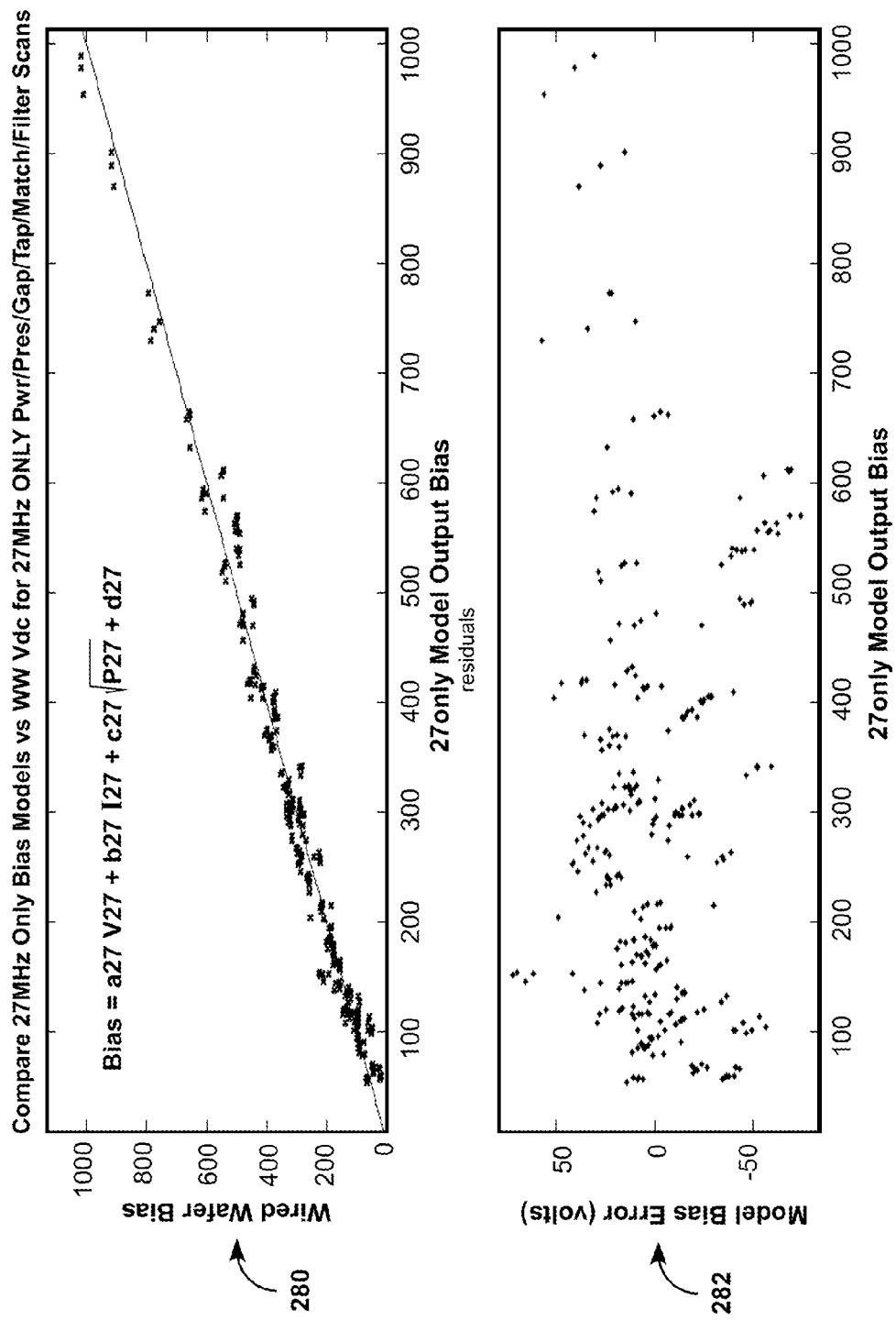
FIG. 12B is a diagram of graphs used to illustrate a correlation between a wired wafer bias measured using a sensor tool, a model bias that is determined using the method of FIG. 2 and using a mathematical conversion, and an error in the model bias when the y MHz RF generator is operational, in accordance with one embodiment described in the present disclosure.

FIG. 12B is a diagram of an embodiment of graphs 280 and 282 to illustrate that there is a correlation between a wired wafer bias, a model bias that is determined using the method 102 (FIG. 2) and a mathematical conversion, and an error in the model bias. The graphs 280 and 282 are plotted in a manner similar to the graphs 276 and 278 (FIG. 12A) except that the graphs 280 and 282 are plotted when the y MHz RF generator is operational and the x and z MHz RF generators are nonoperational. Moreover, the model bias of the graphs 280 and 282 is determined using an equation $a27*V27+b27*I27+c27*sqrt(P27)+d27$, where "V27" represents voltage at an output of the impedance matching model 104, I27 represents current at the output of the impedance matching model 104, P27 represents power at the output of the impedance matching model 104, "a27" is a coefficient, "b27" is a coefficient, "c27" is a coefficient, and "d27" is a constant value.

Figure 12C:
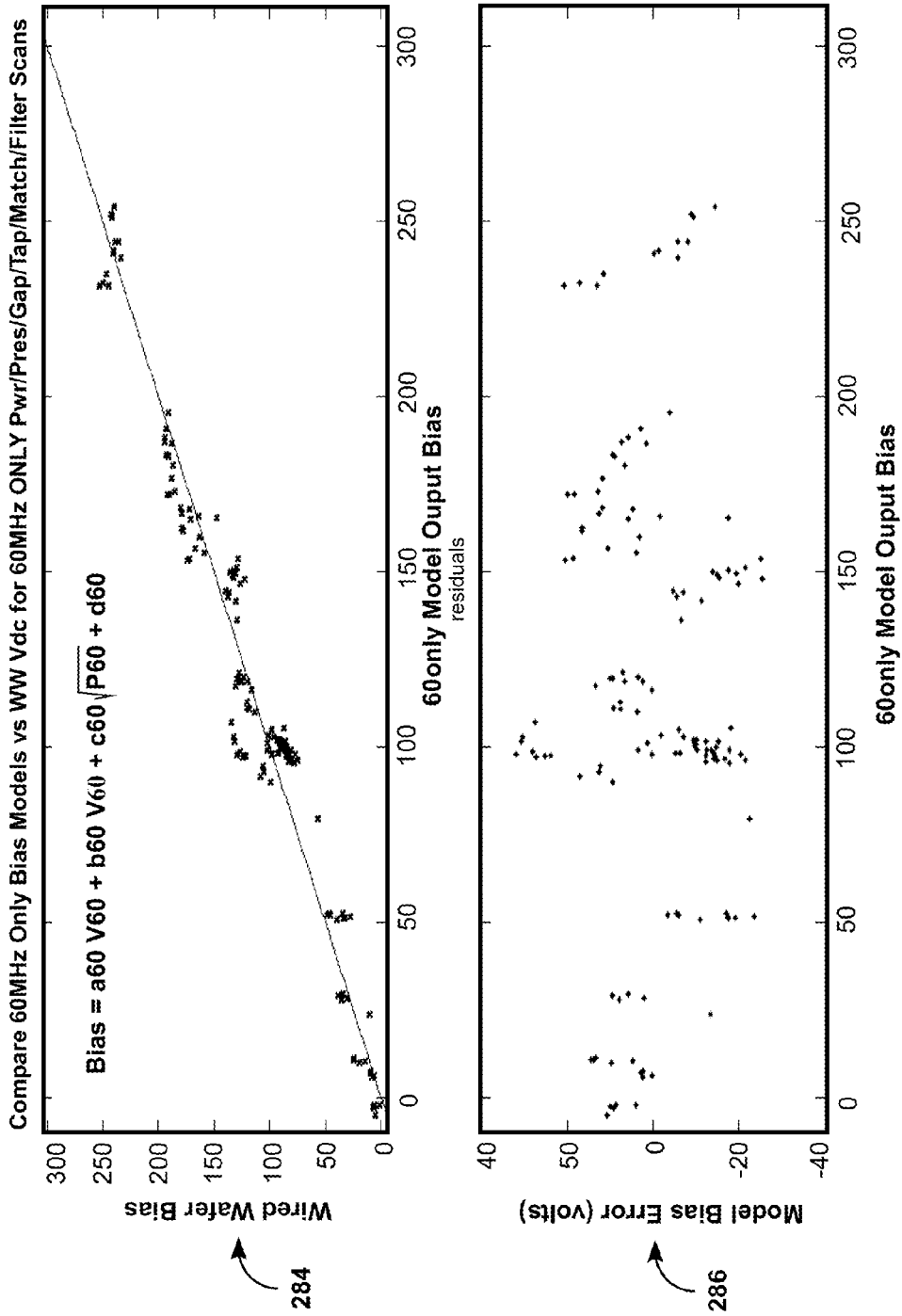
FIG. 12C is a diagram of graphs used to illustrate a correlation between a wired wafer bias measured using a sensor tool, a model bias that is determined using the method of FIG. 2 and using a mathematical conversion, and an error in the model bias when the z MHz RF generator is operational, in accordance with one embodiment described in the present disclosure.

FIG. 12C is a diagram of an embodiment of graphs 284 and 286 to illustrate that there is a correlation between a wired wafer bias, a model bias that is determined using the method 102 (FIG. 2) and a mathematical conversion, and an error in the model bias. The graphs 284 and 286 are plotted in a manner similar to the graphs 276 and 278 (FIG. 12A) except that the graphs 284 and 286 are plotted when the z MHz RF generator is operational and the x and y MHz RF generators are nonoperational. Moreover, the model bias of the graphs 284 and 286 is determined using an equation $a60*V60+b60*I60+c60*sqrt(P60)+d60$, where "V60" represents voltage at an output of the impedance matching model 104, I60 represents current at the output of the impedance matching model 104, P60 represents power at the output of the impedance matching model 104, "a60" is a coefficient, "b60" is a coefficient, "c60" is a coefficient, and "d60" is a constant value.

Figure 12D:
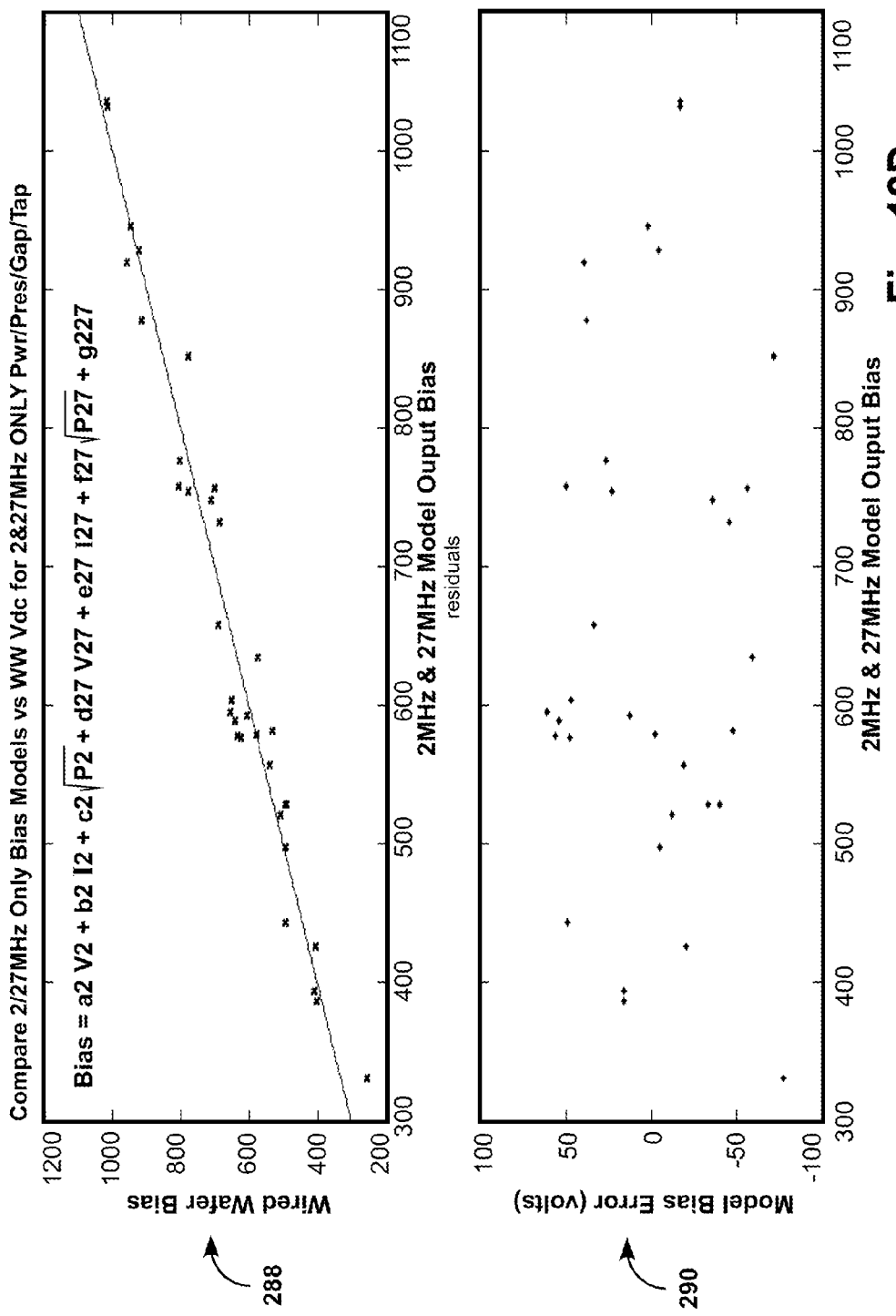
FIG. 12D is a diagram of graphs used to illustrate a correlation between a wired wafer bias measured using a sensor tool, a model bias that is determined using the method of FIG. 2 and using a mathematical conversion, and an error in the model bias when the x and y MHz RF generators are operational, in accordance with an embodiment described in the present disclosure.

FIG. 12D is a diagram of an embodiment of graphs 288 and 290 to illustrate that there is a correlation between a wired wafer bias, a model bias that is determined using the method 102 (FIG. 2) and a mathematical conversion, and an error in the model bias. The graphs 288 and 290 are plotted in a manner similar to the graphs 276 and 278 (FIG. 12A) except that the graphs 288 and 290 are plotted when the x and y MHz RF generators are operational, and the z MHz RF generator is nonoperational. Moreover, the model bias of the graphs 288 and 290 is determined using an equation $a2*V2+b2*I2+c2*sqrt(P2)+d27*V27+e27*I27+f27*sqrt(P27)+g227$, where "d27", "e27" and "f27" are coefficients, and "g227" is a constant value.

Figure 12E:
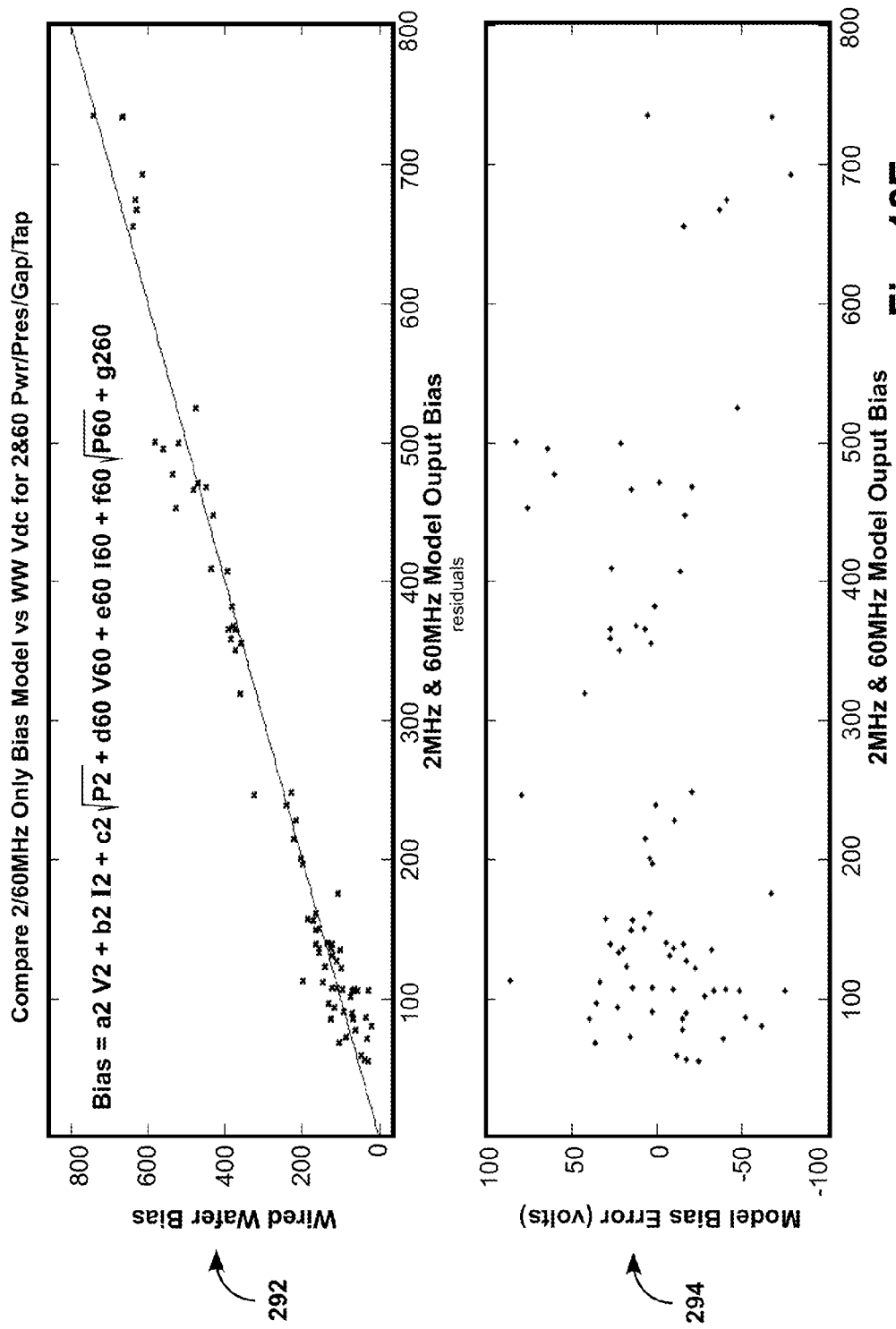
FIG. 12E is a diagram of graphs used to illustrate a correlation between a wired wafer bias measured using a sensor tool, a model bias that is determined using the method of FIG. 2 and using a mathematical conversion, and an error in the model bias when the x and z MHz RF generators are operational, in accordance with an embodiment described in the present disclosure.

FIG. 12E is a diagram of an embodiment of graphs 292 and 294 to illustrate that there is a correlation between a wired wafer bias, a model bias that is determined using the method 102 (FIG. 2) and a mathematical conversion, and an error in the model bias. The graphs 292 and 294 are plotted in a manner similar to the graphs 276 and 278 (FIG. 12A) except that the graphs 292 and 294 are plotted when the x and z MHz RF generators are operational, and the y MHz RF generator is nonoperational. Moreover, the model bias of the graphs 292 and 294 is determined using an equation $a2*V2+b2*I2+c2*sqrt(P2)+d60*V60+e60*I60+f60*sqrt(P60)+g260$, where "d60", "e60" and "f60" are coefficients, and "g260" is a constant value.

Figure 12F:
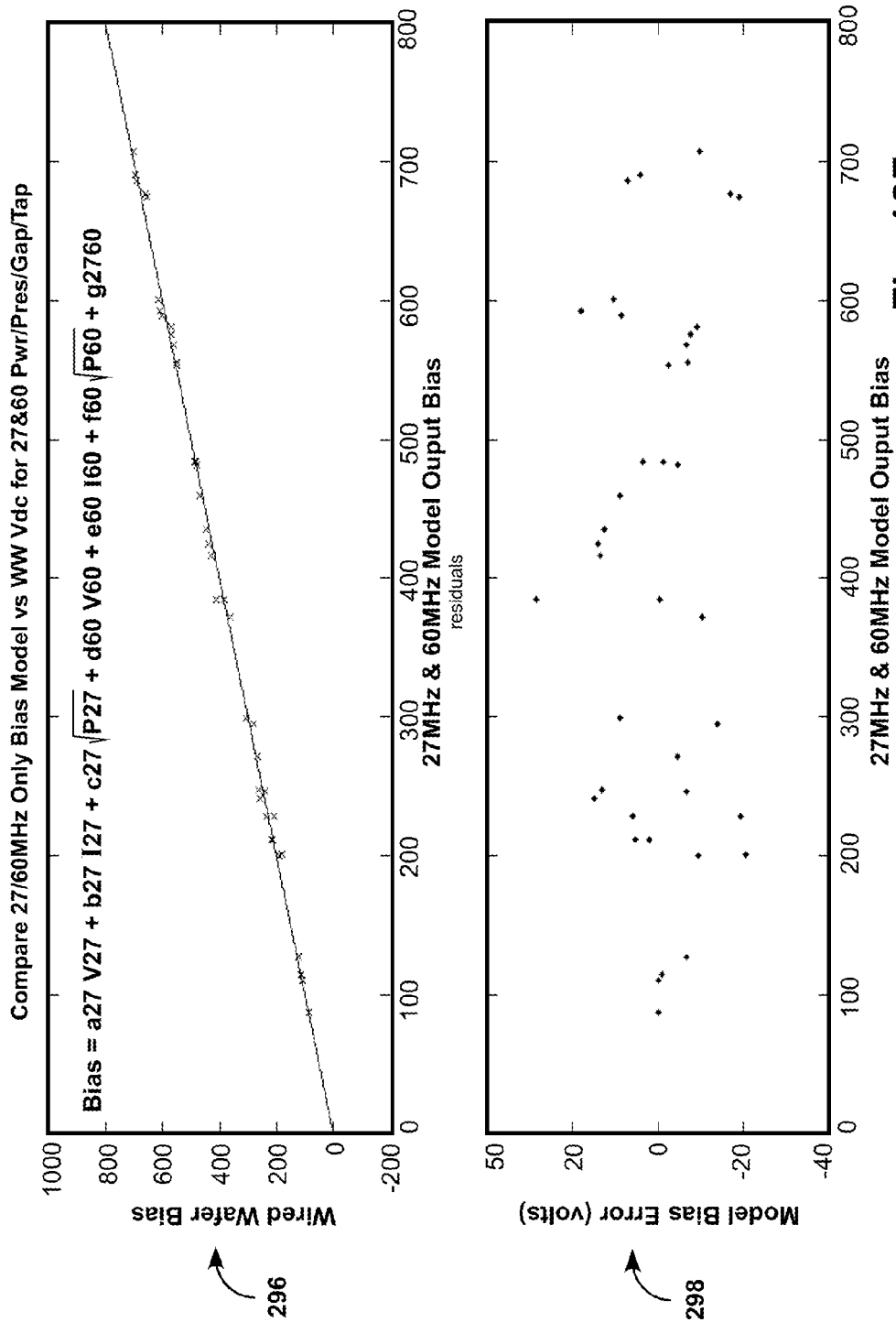
FIG. 12F is a diagram of graphs used to illustrate a correlation between a wired wafer bias measured using a sensor tool, a model bias that is determined using the method of FIG. 2 and using a mathematical conversion, and an error in the model bias when the y and z MHz RF generators are operational, in accordance with an embodiment described in the present disclosure.

FIG. 12F is a diagram of an embodiment of graphs 296 and 298 to illustrate that there is a correlation between a wired wafer bias, a model bias that is determined using the method 102 (FIG. 2) and a mathematical conversion, and an error in the model bias. The graphs 296 and 298 are plotted in a manner similar to the graphs 276 and 278 (FIG. 12A) except that the graphs 296 and 298 are plotted when the y and z MHz RF generators are operational, and the x MHz RF generator is nonoperational. Moreover, the model bias of the graphs 296 and 298 is determined using an equation $a27*V27+b27*I27+$ c27*sqrt (P27)+d60*V60+e60*I60+f60*sqrt (P60)+g2760, where "a27", "b27" and "c27" are coefficients, and "g2760" is a constant value.

Figure 12G:
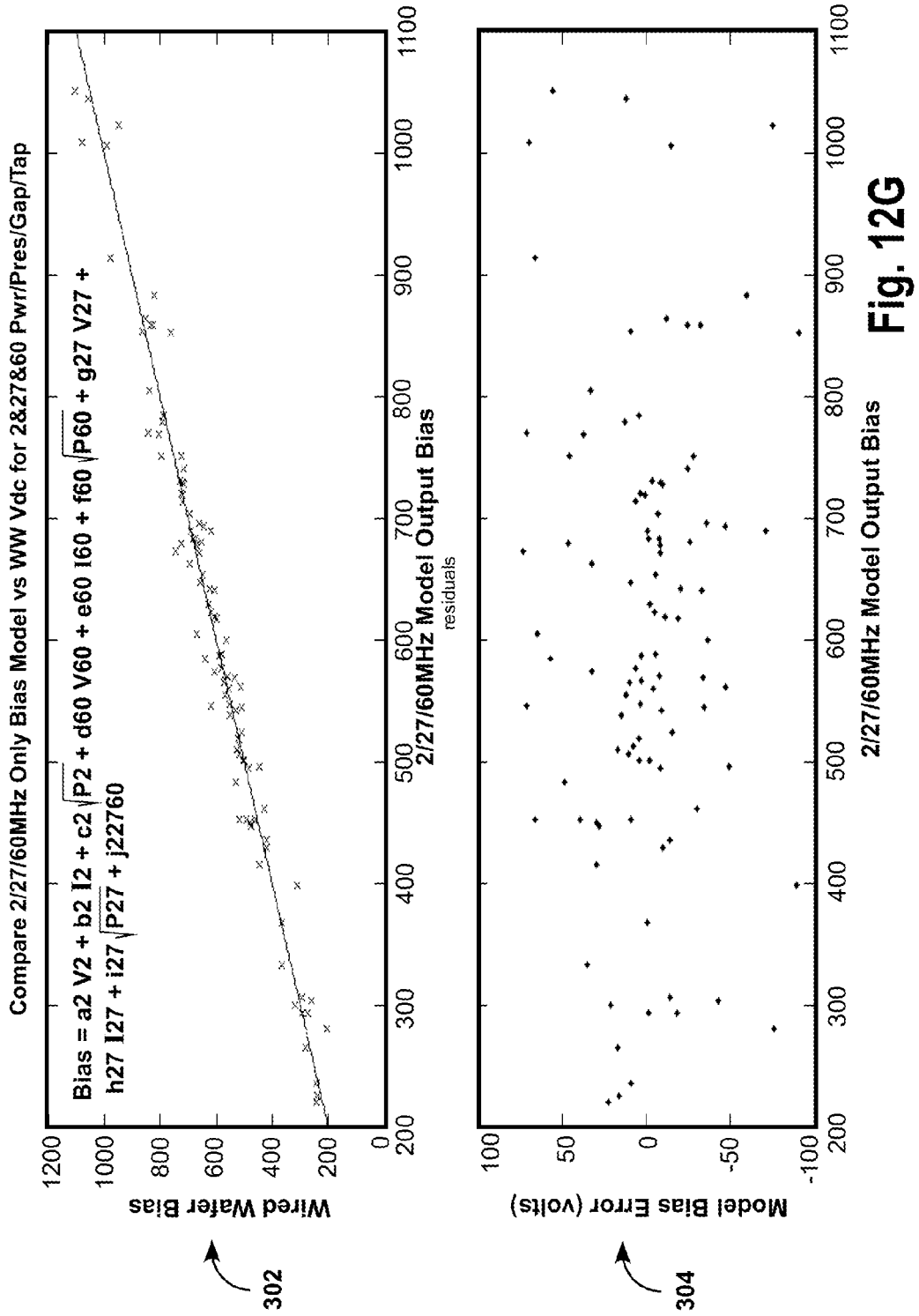
FIG. 12G is a diagram of graphs used to illustrate a correlation between a wired wafer bias measured using a sensor tool, a model bias that is determined using the method of FIG. 2 and using a mathematical conversion, and an error in the model bias when the x, y, and z MHz RF generators are operational, in accordance with an embodiment described in the present disclosure.

FIG. 12G is a diagram of an embodiment of graphs 302 and 304 to illustrate that there is a correlation between a wired wafer bias, a model bias that is determined using the method 102 (FIG. 2) and a mathematical conversion, and an error in the model bias. The graphs 302 and 304 are plotted in a manner similar to the graphs 276 and 278 (FIG. 12A) except that the graphs 302 and 304 are plotted when the x, y and z MHz RF generators are operational. Moreover, the model bias of the graphs 302 and 304 is determined using an equation a2*V2+b2*I2+c2*sqrt (P2)+d60*V60+e60*I60+f60*sqrt (P60)+g27*V27+h27*I27+i27*sqrt (P27)+j22760, where "g27", "h27", and "i27" are coefficients and "j22760" is a constant value.

Figure 13:
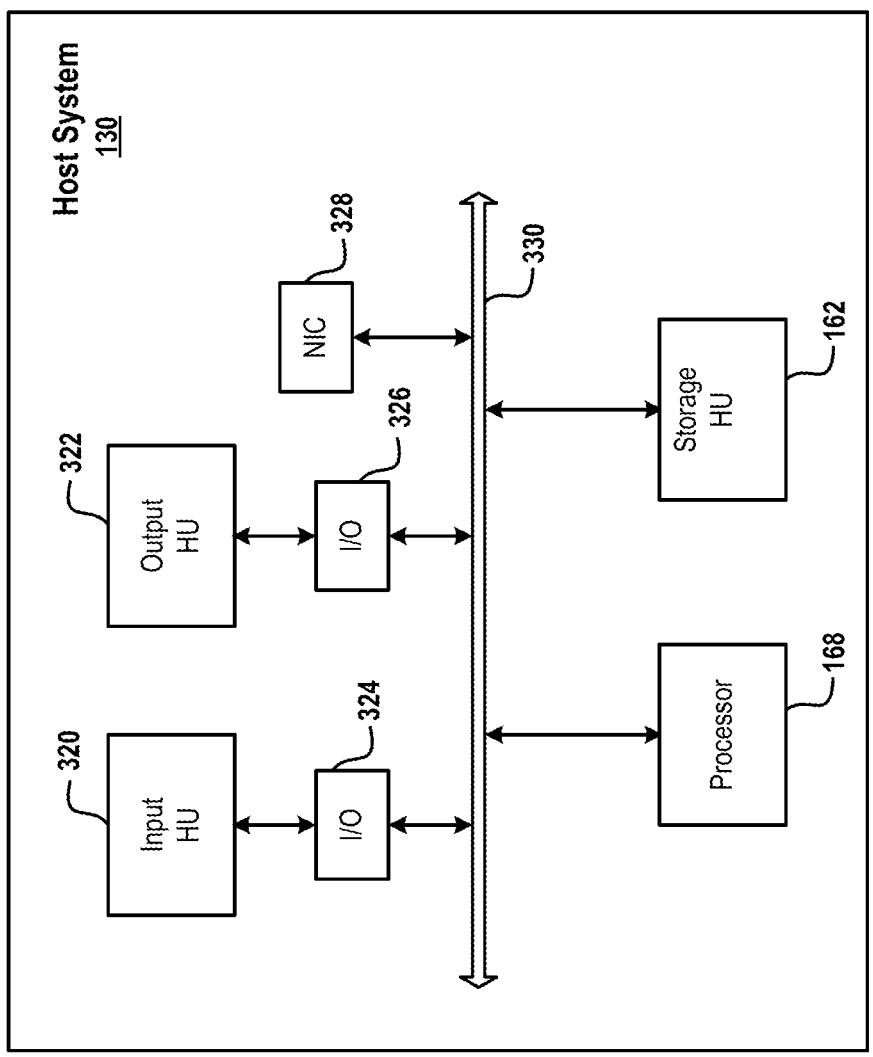
FIG. 13 is a block diagram of a host system of the system of FIG. 2, in accordance with an embodiment described in the present disclosure.

FIG. 13 is a block diagram of an embodiment of the host system 130. The host system 130 includes a processor 168, the storage HU 162, an input HU 320, an output HU 322, an input/output (I/O) interface 324, an I/O interface 326, a network interface controller (NIC) 328, and a bus 330. The processor 168, the storage HU 162, the input HU 320, the output HU 322, the I/O interface 324, the I/O interface 326, and the NIC 328 are coupled with each other via the bus 330. Examples of the input HU 320 include a mouse, a keyboard, a stylus, etc. Examples of the output HU 322 include a display, a speaker, or a combination thereof. The display may be a liquid crystal display, a light emitting diode display, a cathode ray tube, a plasma display, etc. Examples of the NIC 328 include a network interface card, a network adapter, etc.

Examples of an I/O interface include an interface that provides compatibility between pieces of hardware coupled to the interface. For example, the I/O interface 324 converts a signal received from the input HU 320 into a form, amplitude, and/or speed compatible with the bus 330. As another example, the I/O interface 326 converts a signal received from the bus 330 into a form, amplitude, and/or speed compatible with the output HU 322.

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the x MHz RF generator and the y MHz RF generator are coupled to an inductor within the ICP plasma chamber.

It should be noted that although the above-described embodiments relate to providing an RF signal to the electrode of the ESC 177 (FIG. 1) and the ESC 192 (FIG. 10), and grounding the upper electrodes 179 and 264 (FIGS. 1 and 10), in several embodiments, the RF signal is provided to the upper electrodes 179 and 264 while the lower electrodes of the ESCs 177 and 163 are grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations in the flowchart of FIG. 2 above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for determining a value of a variable on a radio frequency (RF) transmission model, the method comprising:
  identifying a first complex voltage and current measured at an output of an RF generator when the RF generator is coupled to a plasma chamber via an impedance matching circuit, the impedance matching circuit having an input coupled to the output of the RF generator and an output coupled to an RF transmission line;
  generating an impedance matching model based on electrical components defined in the impedance matching circuit, the impedance matching model having an input and an output, the input of the impedance matching model receiving the first complex voltage and current, the impedance matching model having one or more elements;

propagating the first complex voltage and current through the one or more elements from the input of the impedance matching model to the output of the impedance matching model to determine a second complex voltage and current, wherein the second complex voltage and current is at the output of the impedance matching model;

generating an RF transmission model based on circuit components defined in the RF transmission line, the RF transmission model having an input and an output, the input of the RF transmission model coupled to the output of the impedance matching model, the RF transmission model having a portion that includes one or more elements, wherein the RF transmission model includes a model of an RF tunnel and a model of an RF strap, the RF tunnel model coupled with the RF strap model; and propagating the second complex voltage and current through the one or more elements of the RF transmission model portion from the input of the RF transmission model to an output of the RF transmission model portion to determine a third complex voltage and current, wherein the third complex voltage and current is at the output of the RF transmission model portion.

2. The method of claim 1, wherein the first complex voltage and current received is measured at the output of the RF generator with a voltage and current probe, the voltage and current probe calibrated according to a pre-set formula.

3. The method of claim 2, wherein the pre-set formula is a standard.

4. The method of claim 3, wherein the standard is a National Institute of Standards and Technology (NIST) standard, wherein the voltage and current probe is coupled with an open circuit, a short circuit, or a load to calibrate the voltage and current probe to comply with the NIST standard.

5. The method of claim 1, wherein the third complex voltage and current includes a voltage value, a current value, and a phase between the voltage value and the current value.

6. The method of claim 1, wherein the output of the RF generator is used to transfer an RF signal to the plasma chamber via the impedance matching circuit and the RF transmission line.

7. The method of claim 1, wherein the electrical components of the impedance matching circuit include capacitors, inductors, or a combination thereof.

8. The method of claim 1, wherein the elements of the impedance matching model include capacitors, inductors, or a combination thereof.

9. The method of claim 1, wherein the electrical components of impedance matching circuit include a combination of capacitors and inductors, wherein the elements of the impedance matching model have similar characteristics as that of the electrical components of the impedance matching circuit.

10. The method of claim 1, wherein the third complex voltage and current at the output of the RF transmission model portion is for use in a system, wherein the system includes an impedance matching circuit and excludes a metrology tool at an output of the impedance matching circuit of the system, wherein the system includes an RF transmission line and excludes a metrology tool at a point on the RF transmission line of the system.

11. The method of claim 1, wherein the impedance matching model and the RF transmission model are generated within a computer.

12. The method of claim 1, wherein propagating the first complex voltage and current through the one or more elements from the input of the impedance matching model to the output of the impedance matching model to determine the second complex voltage and current comprises:

determining an intermediate complex voltage and current within an intermediate node within the impedance matching model based on the first complex voltage and current and characteristics of one or more elements of the impedance matching model coupled between the input of the impedance matching model and the intermediate node; and determining the second complex voltage and current based on the intermediate complex voltage and current and characteristics of one or more elements of the impedance matching model coupled between the intermediate node and the output of the impedance matching model.

13. The method of claim 1, wherein the circuit components of RF transmission line include a combination of capacitors and inductors, wherein the elements of the RF transmission model have similar characteristics as that of the circuit components of the RF transmission line.

14. The method of claim 1, wherein propagating the second complex voltage and current through the one or more elements of the RF transmission model portion from the input of the RF transmission model to the output of the RF transmission model portion to determine the third complex voltage and current comprises:

determining an intermediate complex voltage and current within an intermediate node within the RF transmission model portion based on the second complex voltage and current and characteristics of one or more elements of the RF transmission model portion coupled between the input of the RF transmission model and the intermediate node; and determining the third complex voltage and current based on the intermediate complex voltage and current and characteristics of the one or more elements of the RF transmission model portion coupled between the intermediate node and the output of the RF transmission model portion.

15. A plasma system for determining a value of a variable on a radio frequency (RF) transmission model, comprising:

an RF generator for generating an RF signal, the RF generator associated with a voltage and current probe, wherein the voltage and current probe is configured to measure a first complex voltage and current at an output of the RF generator;

an impedance matching circuit coupled to the RF generator;

a plasma chamber coupled to the impedance matching circuit via an RF transmission line, the impedance matching circuit having an input coupled to the output of the RF generator and an output coupled to the RF transmission line; and a processor coupled to the RF generator, the processor for:
identifying the first complex voltage and current;
generating an impedance matching model based on electrical components defined in the impedance matching circuit, the impedance matching model having an input and an output, the input of the impedance matching model receiving the first complex voltage and current, the impedance matching model having one or more elements;
propagating the first complex voltage and current through the one or more elements from the input of the impedance matching model to the output of the impedance matching model to determine a second complex voltage and current, wherein the second complex voltage and current is at the output of the impedance matching model;

generating an RF transmission model based on electrical components defined in the RF transmission line, the RF transmission model having an input and an output, the input of the RF transmission model coupled to the output of the impedance matching model, the RF transmission model having a portion that includes one or more elements, wherein the RF transmission model includes a model of an RF tunnel and a model of an RF strap, the RF tunnel model coupled with the RF strap model;

propagating the second complex voltage and current through the one or more elements of the RF transmission model portion from the input of the RF transmission model to an output of the RF transmission model portion to determine a third complex voltage and current, wherein the third complex voltage and current is at the output of the RF transmission model portion; and providing the third complex voltage and current for storage to a storage hardware unit.

16. The system of claim 15, wherein the voltage and current probe is calibrated to comply with a pre-set formula.

17. The system of claim 16, wherein the pre-set formula is a standard, wherein the standard is a National Institute of Standards and Technology (NIST) standard, wherein the voltage and current probe is coupled with an open circuit, a short circuit, or a load to calibrate the voltage and current probe to comply with the NIST standard.

18. A computer system for determining a value of a variable on a radio frequency (RF) transmission model, the computer system comprising:

a processor configured to:

identify a first complex voltage and current measured at an output of an RF generator when the RF generator is coupled to a plasma chamber via an impedance matching circuit, the impedance matching circuit having an input coupled to the output of the RF generator and an output coupled to an RF transmission line;

generate an impedance matching model based on electrical components defined in the impedance matching circuit, the impedance matching model having an input and an output, the input of the impedance matching model receiving the first complex voltage and current, the impedance matching model having one or more elements;

propagate the first complex voltage and current through the one or more elements from the input of the impedance matching model to the output of the impedance matching model to determine a second complex voltage and current, wherein the second complex voltage and current is at the output of the impedance matching model;

generate an RF transmission model based on electrical components defined in the RF transmission line, the RF transmission model having an input and an output, the input of the RF transmission model coupled to the output of the impedance matching model, the RF transmission model having a portion that includes one or more elements, wherein the RF transmission model includes a model of an RF tunnel and a model of an RF strap, the RF tunnel model coupled with the RF strap model; and propagate the second complex voltage and current through the one or more elements of the RF transmission model portion from the input of the RF transmission model to an output of the RF transmission model portion to determine a third complex voltage and current, wherein the third complex voltage and current is at the output of the RF transmission model portion; and a memory device coupled to the processor, the memory device configured to store the third complex voltage and current.

19. The computer system of claim 18, wherein the first complex voltage and current received is measured at the output of the RF generator with a voltage and current probe, the voltage and current probe calibrated according to a pre-set formula.

20. The computer system of claim 19, wherein the voltage and current probe is decoupled from a digital signal processor of the RF generator.

\* \* \* \* \*